US006586921B1

(12) United States Patent
Sunter

(10) Patent No.: US 6,586,921 B1
(45) Date of Patent: Jul. 1, 2003

(54) METHOD AND CIRCUIT FOR TESTING DC PARAMETERS OF CIRCUIT INPUT AND OUTPUT NODES

(75) Inventor: Stephen Kenneth Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 09/570,412

(22) Filed: May 12, 2000

(51) Int. Cl.$^7$ .................. G01R 19/00; G01R 31/02; G01R 1/04
(52) U.S. Cl. ............... 324/76.11; 324/754; 324/763; 324/158.1
(58) Field of Search ............... 324/76.11, 754, 324/763, 158.1; 714/726, 729, 727, 724; 371/22.1, 21.1, 22.5, 22.3

(56) References Cited

U.S. PATENT DOCUMENTS

| | | | |
|---|---|---|---|
| 4,117,400 A | | 9/1978 | Feldman |
| 4,578,637 A | | 3/1986 | Allen et al. |
| 4,697,151 A | | 9/1987 | Butler |
| 5,323,107 A | | 6/1994 | D'Souza |
| 5,371,457 A | | 12/1994 | Lipp |
| 5,402,072 A | | 3/1995 | Chiang et al. |
| 5,477,545 A | * | 12/1995 | Huang ..................... 324/158.1 |
| 5,569,951 A | | 10/1996 | Grace et al. |
| 5,621,739 A | | 4/1997 | Sine et al. |
| 5,640,095 A | | 6/1997 | Beier et al. |
| 5,642,364 A | | 6/1997 | Farwell |
| 5,648,973 A | | 7/1997 | Mote, Jr. |
| 5,670,890 A | * | 9/1997 | Colwell et al. ............. 324/765 |
| 5,696,773 A | | 12/1997 | Miller |
| 5,701,666 A | * | 12/1997 | DeHaven et al. .......... 324/754 |
| 5,736,849 A | * | 4/1998 | Terayama ................. 324/158.1 |
| 5,789,933 A | | 8/1998 | Brown et al. |
| 5,815,043 A | | 9/1998 | Chow et al. |
| 6,000,051 A | | 12/1999 | Nadeau-Dostie et al. |
| 6,101,457 A | * | 8/2000 | Barch et al. ............... 324/73.1 |
| 6,158,032 A | * | 12/2000 | Currier et al. ............. 324/763 |
| 6,286,119 B1 | * | 9/2001 | Wu et al. .................... 714/726 |

FOREIGN PATENT DOCUMENTS

EP          0 902 298 A2    3/1999

* cited by examiner

Primary Examiner—Kamand Cuneo
Assistant Examiner—Jermele Hollington
(74) Attorney, Agent, or Firm—Killworth, Gottman, Hagan & Schaeff LLP

(57) ABSTRACT

A method and built-in circuit are described for testing direct current (DC) parameters of the input and output pins of a circuit by testing the transition time interval for rising and falling voltage transitions. When the voltage transition is for an integrated circuit (IC) pin having a known capacitance, which can include off-chip capacitance, the magnitude and direction of current at the pin can be determined. The method enables testing an IC via a test access port (TAP) comprising a subset of the pins of the IC, for example in conformance with the IEEE 1149.1 boundary scan test standard. For sufficiently small current magnitudes, such as leakage current (IIL and IIH), the technique can use only on-chip circuitry to sample a pin voltage at time intervals after an output transition is generated at the pin, the time intervals pre-determined to be less than the transition time interval. For larger current magnitudes, such as IOL and IOH, an off-chip capacitance of known value is connected to the pin to decrease the rate of transition. For greater accuracy, an off-chip resistor of known value is connected to the pin, and the transition time interval due to the driver is compared to the transition time interval due to the resistor.

47 Claims, 22 Drawing Sheets

METHOD AND CIRCUIT FOR TESTING DC PARAMETERS OF CIRCUIT INPUT AND OUTPUT NODES

BACKGROUND OF THE INVENTION

When testing an integrated circuit (IC), the number of signals driven and received by the test equipment (tester) is typically equal to the number of signal pins of the IC. It is possible for an IC to have hundreds or thousands of signal pins, and the tester that tests these ICs can be very expensive because the cost of a tester is linearly dependent on the number of signals it drives and receives. It is desirable to minimize the number of signals that a tester must drive and receive from an IC, to reduce the cost of the tester or to permit more ICs to be tested in parallel by the tester.

When testing an IC at the wafer level (i.e., while it is still part of a wafer containing many of the ICs), a probe card which allows tester access to the individual ICs typically has the same number of probes as the number of bond pads on the IC. Bond pads are the metal sites to which a wire or solder will eventually be bonded to convey signal and power between an IC and a substrate or pins of an enclosing package. The quality of the probe to bond pad connection, the inductance of the probe card wires and probes, and the capacitances of these wires can all contribute to degraded signal integrity at high frequencies. For these reasons, as well as the material cost of each probe, it is desirable to minimize the number of probes needed for wafer-level testing of each IC.

Typical circuit elements that provide paths for leakage current to and from a circuit node, a pin (or bond pad) of an IC are shown in FIG. 1. The leakage can be caused by many sources, including, but not limited to, electro-static discharge (ESD) protection diodes 19, 20, faulty metal-oxide-semiconductor (MOS) transistor gates 11, 12, pull-up circuits 15, 17, pull-down circuits 16, 18, and other semiconductor elements. Most ICs have specifications stating the maximum leakage current that the IC will have at any input pin or at any 3-state output pin when the output driver is disabled and the pin has high-impedance output. It is therefore important to test that these leakage currents are less than the specified maximum. The purpose of pull-up or pull-down circuits 15–18 is to "pull" the voltage of an un-driven pin to a higher or lower voltage such as $V_{DD}$ or $V_{SS}$. Accordingly, for pins with pull-up or pull-down circuits 15–18, it is usually important to test that the current is between a lower limit and an upper limit.

The standard terms used in industry for denoting input pin DC parameters are: IIL (maximum current for input at logic low), IIH (maximum current for input at logic high), VIL (maximum voltage for input at logic low), and VIH (minimum voltage for input at logic high). The standard terms for denoting output pin DC parameters are: IOL (maximum current for output pin at logic low), IOH (maximum current for output at logic high), VOL (maximum voltage for output at logic low while delivering IOL), and VOH (minimum voltage for output at logic high while delivering IOH).

Leakage current due to intrinsic current through reverse-biased diodes 19, 20 and MOS transistor gates 11, 12 is typically much less than 1 microamp ($\mu$A) in a fault-free circuit. Leakage current due to pull-up or pull-down circuitry 15–18 is typically between 10 and 150 $\mu$A. In some ICs, for example as shown in U.S. Pat. No. 5,670,890 issued to Colwell et al on Sep. 23, 1997, the pull-up and pull-down circuitry is disabled while testing the leakage current caused by other circuitry.

It is therefore important to be able to set different test limits for different pins. For example, pins with a pull-up circuit may require testing that the current is between –50 and –150 $\mu$A; pins with a pull-down circuit may require testing that the current is between +30 and 10 $\mu$A; other pins may require the current be between +1 and –1 $\mu$A.

Throughout this disclosure, the current at a pin is positive if it flows into the IC, and negative if it flows out of the IC, when the pin is connected to any voltage between $V_{DD}$ and $V_{SS}$. Unsigned current may be positive or negative.

In general, the causes of leakage current are so diverse that the test limits are very tolerant of variation. Nevertheless, measuring currents at hundreds or thousands of pins of an IC can be expensive: the tester must have a parametric measurement unit (PMU) for each pin to allow testing all pins in parallel, or the tester must test one pin at a time if only one PMU is available.

It is typical in industry to specify the maximum leakage current as 1 $\mu$A even though the expected current is less than 1 nA, because the test time to verify 1 nA can be excessive. For example, the pin's capacitance to ground might be 1 picofarad (pF), but the tester coaxial cabling connected to the pin might have capacitance of 50 pF. The time for a 1 nA current to discharge 50 pF by 1 volt, is 50 ms, whereas if 1 $\mu$A is used, the discharge time is only 50 $\mu$s. Smaller voltage differences can be measured to decrease test time, but noise tolerance diminishes.

A standard technique for testing current at a pin is based upon connecting a current source to the pin, applying a pre-determined current (IIL or IIH, for inputs, and IOL or IOH, for outputs), and measuring the resulting voltage at the pin. This technique is used to measure a very wide range of currents, from amperes to nanoamperes, and can therefore measure output drive current and input leakage current. A standard variation of this technique is to continuously increase the current until a pre-determined pin voltage (VOL or VOH for outputs) is reached. Both techniques require direct connection to the pin under test.

Another prior art technique for testing leakage current at a pin is based upon connecting a voltage source to the pin via a high impedance resistor and measuring the resulting steady-state voltage across the resistor, for example as shown in U.S. Pat. No. 5,569,951 issued to Grace and DiPietro on Oct. 29, 1996.

Prior art techniques exist for testing leakage current at a power supply pin of an IC, when all circuitry in the IC is inactive (or "quiescent"). This current is known as $I_{DDQ}$ and if it is excessive (e.g., greater than 100 $\mu$A), it may indicate that a fault exists somewhere among the thousands of MOS transistors of an IC, because when these transistors are inactive they normally conduct no current between the power and ground supplies. Some prior art $I_{DDQ}$ measuring techniques disconnect the IC from the power supply briefly (e.g., less than 1 ms), when the IC is known to be inactive, and connect the IC to the power supply via a resistance, for example, as shown in U.S. Pat. No. 5,371,457 issued to Lipp on Dec. 6, 1994. By measuring the voltage across the resistance, small currents are measured very quickly, before the voltage at the power supply pin of the IC decreases more than a few hundred millivolts. The power supply voltage is then quickly restored to ensure that no logic state changes are induced on the IC.

One proposed solution for testing ICs with a tester and probe card containing fewer signals and probes than the IC's number of bond pads, is to use the IEEE 1149.1 (also called JTAG) boundary scan standard for test access. This well-known test standard defines 1149.1-compliant ICs as having a TAP comprising 4 or 5 test pins, a TAP controller, and other on-chip circuitry including a digital shift register to convey logic signals to and from the non-test pins of the IC. One of the test pins, denoted TCK, is a test clock typically having a constant period (e.g., 100 ns). Although not described in 1149.1, if all non-test pins of the IC have both a driver and input logic buffer connected to them, regardless of whether they function as an input, output, or bi-directional pin, then structural integrity of each pin's driver and input buffer can be tested by performing a "wrap-around" test.

A wrap-around test consists of driving a pin to each logic value (0, 1), and then sampling the output of the input logic buffer whose input is connected to the pin, after a time interval in which the pin voltage is certain to have settled at a steady-state voltage. This procedure can be performed using test patterns and sequences defined in the 1149.1 standard. The typical test clock frequency ranges from 1 MHz to 20 MHz. Accordingly, for ICs that are compliant with the 1149.1 standard, the shortest time interval between initiating a logic transition at a pin and capturing the resulting value is 2½ clock periods and hence ranges from 2.5 μs to 125 ns. Typical logic transition times at the pins of an IC are between 2 ns and 20 ns.

The procedure described in the preceding paragraph is therefore performed with a sampling clock period that is slow enough to be insensitive to the parametric variations which are described in the next four paragraphs.

The wrap-around test procedure described does not detect excessive leakage current at a pin. For input pins with a pull-up or pull-down circuit, neither insufficient nor excessive pull-up/down current will be detected by the wrap-around test because the pins are always driven with relatively low-impedance drivers. For 3-state output pins, leakage current (while the driver is in high-impedance mode) may indicate a delay fault, an unreliable structure, or some other such subtle defect, none of which would be acceptable or detected by the wrap-around test. The leakage current for a 2-state output driver (with two, low impedance output states) is immaterial because the driver is always driving with low impedance; any leakage could only be detected by an $I_{DDQ}$ test.

The wrap-around test procedure described does not detect insufficient or excessive output drive. The sampling clock period is intentionally chosen to be longer than the time for the slowest pin signal to settle at a steady-state value, so that only catastrophic structural faults are detected.

The wrap-around test procedure described does not detect faults in the input switching point voltage ($V_{SW}$). Excessive mismatch in the transistor sizes of an input buffer causes its $V_{SW}$ to be too low or too high and degrades noise tolerance for the input, but it does not degrade performance enough to be detected with the relatively noise-free and fast transition times of a simple wrap-around test.

The wrap-around test procedure described does not detect missing bond wire connections between bond pads and package pins because the characteristics of the bond pad are not changed sufficiently by connecting it to a package pin alone (with no connection to the external tester). Testing bond wire integrity is an important test for a packaged IC because the bond wire connection is the only circuitry added to an IC after wafer-level testing.

The problems described for the wrap-around test procedure have discouraged many companies from using the test technique as a way to reduce the number of probes or tester channels connected to an IC under test.

Input current leakage, input switching point voltage tests, and output drive tests are considered by manufacturers and their customers to be important tests. It is therefore desirable to provide a test technique that performs one or more of these tests through a standard test access infrastructure via a small number of probes and tester channels, to enable a higher quality test than is achievable with a conventional wrap-around test while allowing lower cost testing.

SUMMARY OF THE INVENTION

The invention described herein uses testing circuitry connected to a circuit node of a circuit under test. The circuit node may be an input or output node, for example an IC bond pad or a IC package pin. The testing circuitry comprises on-chip test circuitry connected to the circuit node. The invention implements a test method that can be performed by applying signals via a test access port to cause a signal transition at the circuit node, and a sampling of the circuit node signal after a predetermined time interval. The test access port may be a TAP controller described in the IEEE 1149.1 standard or one modified. The invention includes circuitry to allow the predetermined time interval to be shorter than possible with the prior art IEEE 1149.1 TAP controller.

In accordance with an aspect of the present invention, there is provided a method for testing current flowing through a circuit node of a circuit under test. The circuit under test includes drive circuitry that drives the circuit node to a maximum and to a minimum voltage during testing, and includes a logic circuit that samples the logic level of the circuit node synchronously to a clock signal. The circuit node has a capacitance. The logic circuit has an input switching point voltage. The method comprising the steps of driving the circuit node to a known voltage, via the drive circuitry that drives the circuit node; causing a signal transition at the circuit node, via the drive circuitry; sampling a logic value of a voltage of the circuit node, via the logic circuit, at a predetermined time interval after the beginning of the signal transition, the time interval being less than an expected signal transition time and being proportional to values of the capacitance of the circuit node, the input switching point voltage of the logic circuit, and the current flowing through the circuit node; and passing or failing the test, based on the logic value sampled by the logic circuit during the signal transition.

In accordance with another aspect of the invention, there is provided a method for testing current flowing through a circuit node of a circuit under test. The circuit under test includes drive circuitry that drives the circuit node to a maximum and to a minimum voltage during testing, and includes a logic circuit that samples the logic level of the circuit node. The circuit node has a capacitance. The logic circuit has an input switching point voltage. The method comprises the steps of providing a first test clock for generating test control signals; providing a second clock with a significantly higher frequency than the first test clock; using an edge of the second test clock, which immediately follows an edge of the first test clock, to generate a signal transition on the circuit node via the drive circuitry; using a subsequent edge of the second test clock to sample the voltage of the circuit node; and controlling a time interval between the edges of the second test clock to be less than an expected transition time of the signal transition and to be proportional to values of the capacitance of the circuit node, the input switching point voltage for the circuit node, and the current flowing through the circuit node.

In accordance with another aspect of the invention, there is provided a control signal modifying circuit for modifying a test control signal generated by a test controller for controlling drive circuitry that drives a circuit node of a circuit under test and logic circuitry that samples the voltage of the circuit node. The test controller has a test clock for generating the test control signal and transitions between states for the test controller. The control signal modifying circuit comprises receiving means, modifying means and outputting means. The receiving means is provided for receiving the test control signal generated by the test controller. The modifying means is provided for modifying the test control signal to provide a predetermined time interval which is less than an expected signal transition time and proportional to values of the capacitance of the circuit node, the input switching point voltage of the logic circuit, and the current flowing through the circuit node. The outputting means is provided for outputting the modified test control signal to the drive circuitry and logic circuitry.

In accordance with another aspect of the invention, there is provided testing circuitry for testing current flowing through a circuit node of a circuit under test. The circuit node has a capacitance. The testing circuitry comprises drive circuitry, a logic circuit, a test controller and a control signal modifying circuit. The drive circuitry drives the circuit node to a maximum and to a minimum voltage during testing. The logic circuit samples the logic level of the circuit node synchronously to a clock signal, and has an input switching point voltage. The test controller controls the drive circuitry and the logic circuitry, and has a test clock for generating the test control signal and transitions between states for the test controller. The control signal modifying circuit modifies the test control signal to provide a predetermined time interval which is less than an expected signal transition time and proportional to values of the capacitance of the circuit node, the input switching point voltage of the logic circuit, and the current flowing through the circuit node.

Other aspects and features of the present invention will be readily apparent to those skilled in the art from a review of the following detailed description of preferred embodiments in conjunction with the accompanying drawings.

BRIEF DESCRIPTION OF THE DRAWINGS

The present invention will be readily understood with reference to the accompanying figures, wherein the reference numerals designate structural elements, and in which.

DETAILED DESCRIPTION OF THE PREFERRED EMBODIMENTS

Figure 1:
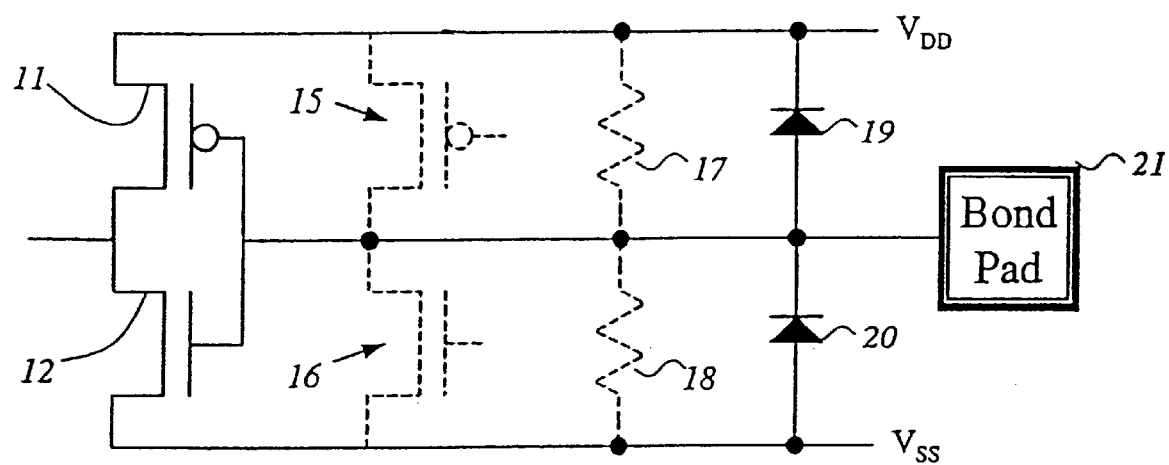
FIG. 1 is a circuit schematic showing circuit elements that are typical leakage paths for a bond pad of an IC.

A primary objective of the invention is to facilitate testing of various DC parameters at circuit nodes of a circuit under test without requiring a tester to connect directly to the circuit nodes. The circuit nodes may be circuit input or output nodes, such as pins or bond pads of an IC.

Testing circuitry in accordance with preferred embodiments of the present invention will be described herein, and then the method in accordance with preferred embodiments of the present invention will be described. The present invention is applicable to any circuit under test. The preferred application is an IC. The present invention is applicable to any circuit node, including circuit input and output bond pads and pins. The preferred application is to input and output bond pads of an IC. Accordingly, the embodiments are described mainly using bond pads of an IC, but the application of the present invention is not limited to these specific applications.

Circuitry to Facilitate Testing According to the Present Invention

A testing circuitry in accordance with an embodiment of the present invention uses an on-chip test circuitry connected to a bond pad of an IC. The test circuitry implements a wrap-around function at the bond pad, test access, and test control.

There are different types of bond pads, such as, input-only bond pads, 3-state output-only bond pads and bi-directional bond pads.

To implement a wrap-around function, for input-only bond pads, means are added which can drive the bond pad to a minimum or maximum voltage and which can be disabled. The driving means may comprise a 2-state or 3-state driver. The input signals of the means for driving the bond pad are controlled by a test register. The test register may be an IEEE 1149.1 boundary scan register.

For 3-state output-only bond pads, means are added to sample the logic level of the bond pad. The sampling means may comprises an input buffer. The logic level of the bond pad is sampled by a test register, using clock frequencies and clock edges that are pre-determined, based upon the expected magnitude of the current, the capacitance of the bond pad, and the logic voltage levels. The test register may be an IEEE 1149.1 boundary scan register.

To test an IC, the present invention may use known circuits with additional circuitry. Some known circuits suitably used in the present invention are first described and then additional circuitry is described.

It is typical for an IC to have a system clock frequency for clocking the main function of the IC. FIG. 2A shows an IC 200 with on-chip test circuitry 210 comprising IEEE 1149.1 boundary scan circuit 214 having boundary scan cells 216 and a TAP controller 119. The boundary scan cells 216 have test registers. The boundary scan cells 216 are connected to bond pads 21 and a core circuit 202 of the IC 200.

The IC 200 has a second clock, often denoted as a test clock or TCK 99, to clock test circuitry 210 during test mode. The test clock frequency used for boundary scan is typically lower than the system clock frequency so that less stringent design practices may be followed for the test circuitry 210. For example, the boundary scan test clock frequency is almost always less than 50 MHz, and is typically 10 MHz or less, whereas system clock frequencies are often greater than 50 MHz.

Figure 4A:
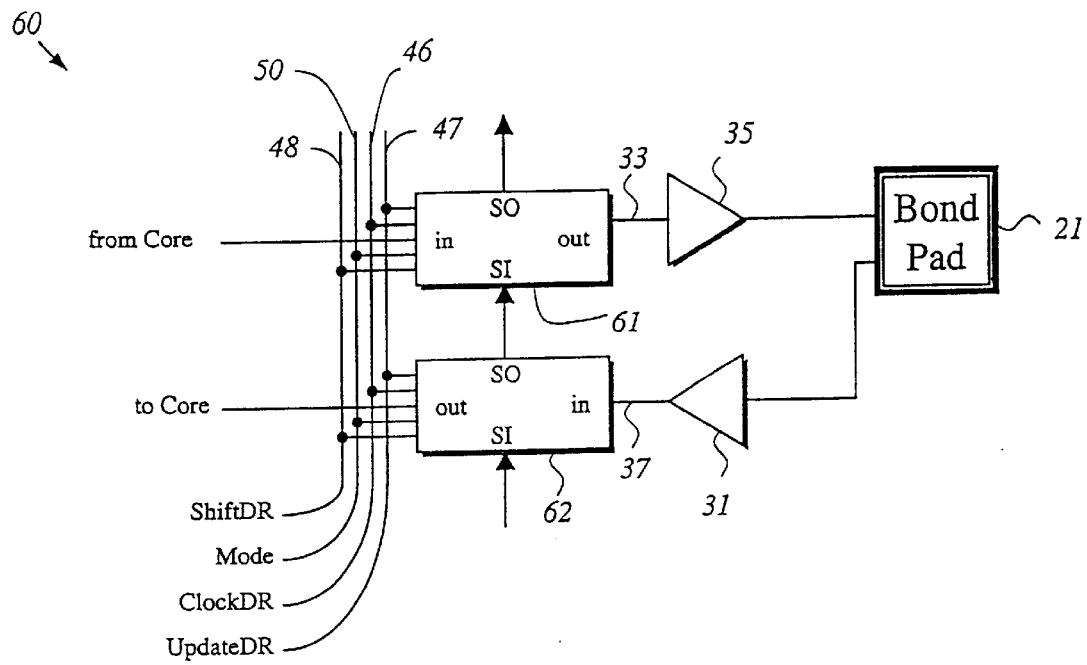
FIG. 4A is a circuit schematic showing a connection between a 2-state output bond pad, with wrap-around and boundary scan cells compliant with the IEEE 1149.1 standard.

In addition to TCK 99, the TAP controller 119 also receives a test mode status signal (TMS) 98 and test data in signal (TDI) 111, and outputs a test data out signal (TDO) 112. In order to control the boundary scan cells 216, the TAP controller 119 generates control signals 220 to the boundary scan cells 216. The control signals 220 include signals ClockDR 46, UpdateDR 47, ShiftDR 48 and Mode 50, as shown in FIG. 4A.

During the test of an IC, the system clock frequency and the test clock frequency may be decreased below the maximum value specified for the IC. In the present invention, it is preferred that the clock frequencies can be varied to achieve sampling intervals which are not integer multiples of the nominal system or test clock periods. This can be accomplished using test software that controls the clocks generated by a tester, or it can be performed by the IC itself using on-chip circuitry that generates clock signals, for example, like the circuit described in U.S. Pat. No. 5,815,043 issued to Chow et al on Sep. 29, 1998.

Figure 2:
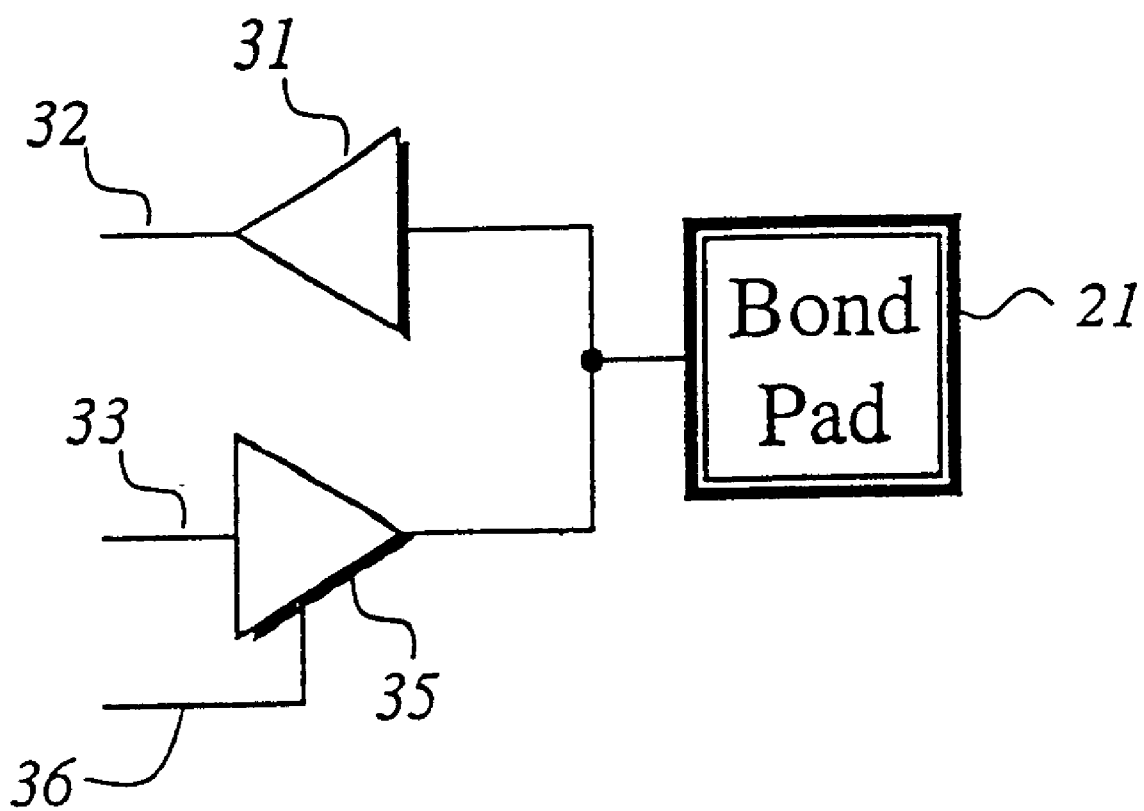
FIG. 2 is a circuit schematic showing a bond pad connected to 3-state bi-directional circuitry.
Figure 2A:
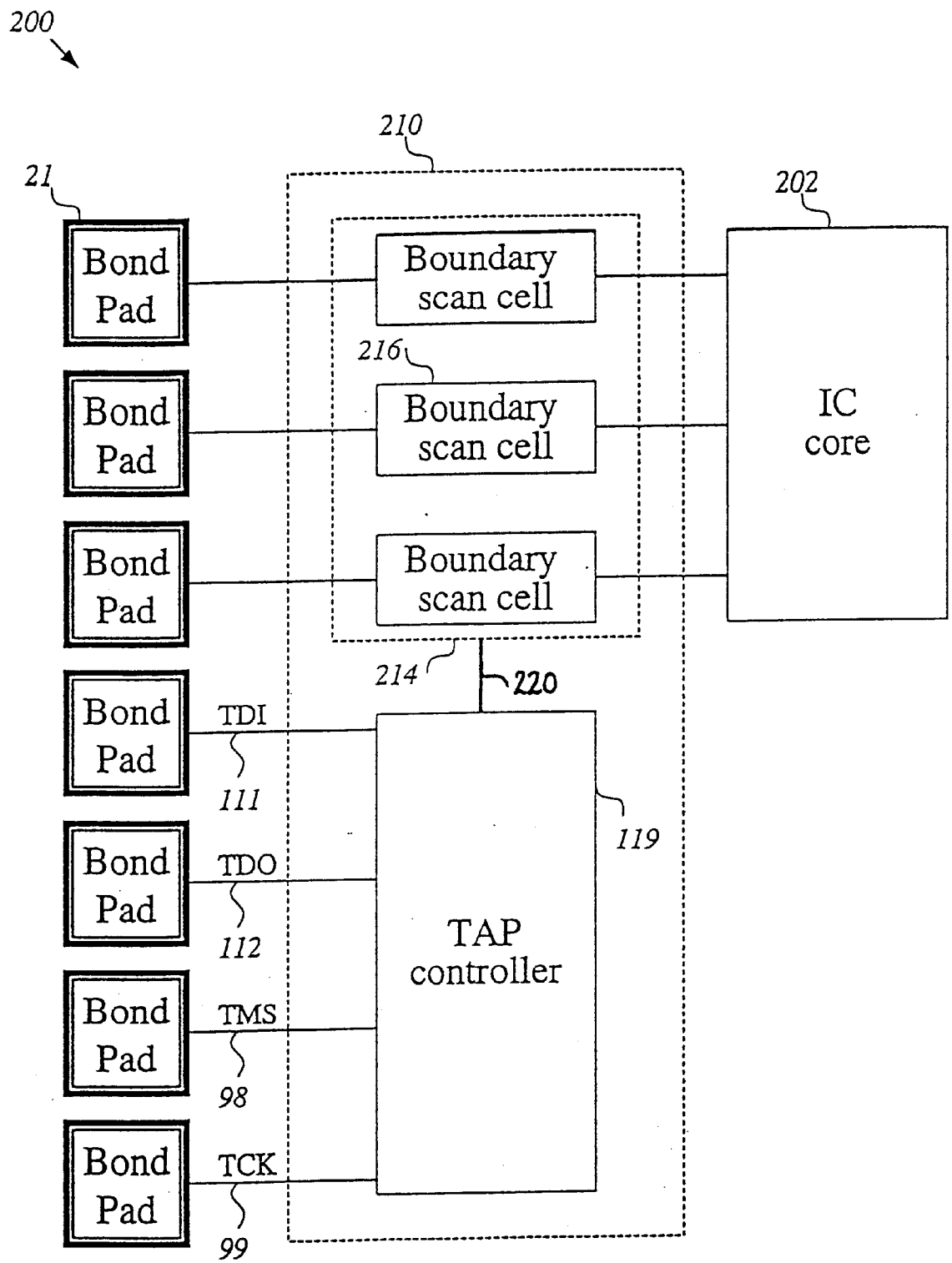
FIG. 2A is a diagram showing major elements for IEEE boundary scan.
Figure 4B:
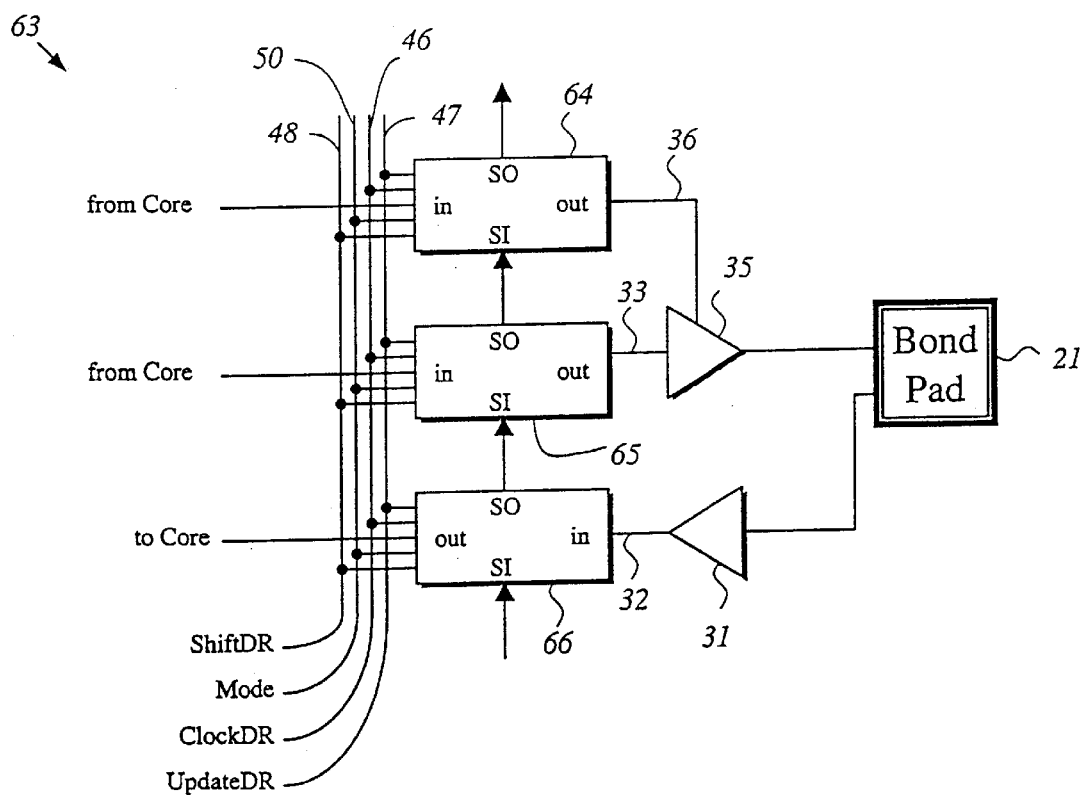
FIG. 4B is a circuit schematic showing a connection between a 3-state bi-directional bond pad and three boundary scan cells like those in FIG. 3A, as described in the IEEE 1149.1 standard.

To facilitate testing of leakage current at an input bond pad 21, an on-chip 3-state driver 35 is also connected to the bond pad 21, as shown in FIG. 2. Other circuitry such as a pull-up 15, 17 or pull-down 16, 18, and ESD protection 19, 20, may already be connected to the bond pad 21 as shown in FIG. 1 (but not shown in FIG. 2). To facilitate boundary scan testing of circuitry connected to the bond pad 21, a boundary scan cell 216 (FIG. 2A) may also be connected as blocks 61 and 62 of the circuit 60 via an input buffer 31 and a driver 35 as shown in FIG. 4A, or as blocks 64, 65 and 66 in the circuit 63 via an input buffer 31 and a driver 35 as shown in FIG. 4B. The circuits 60 and 63 are consistent with the IEEE 1149.1 standard.

Figure 3A:
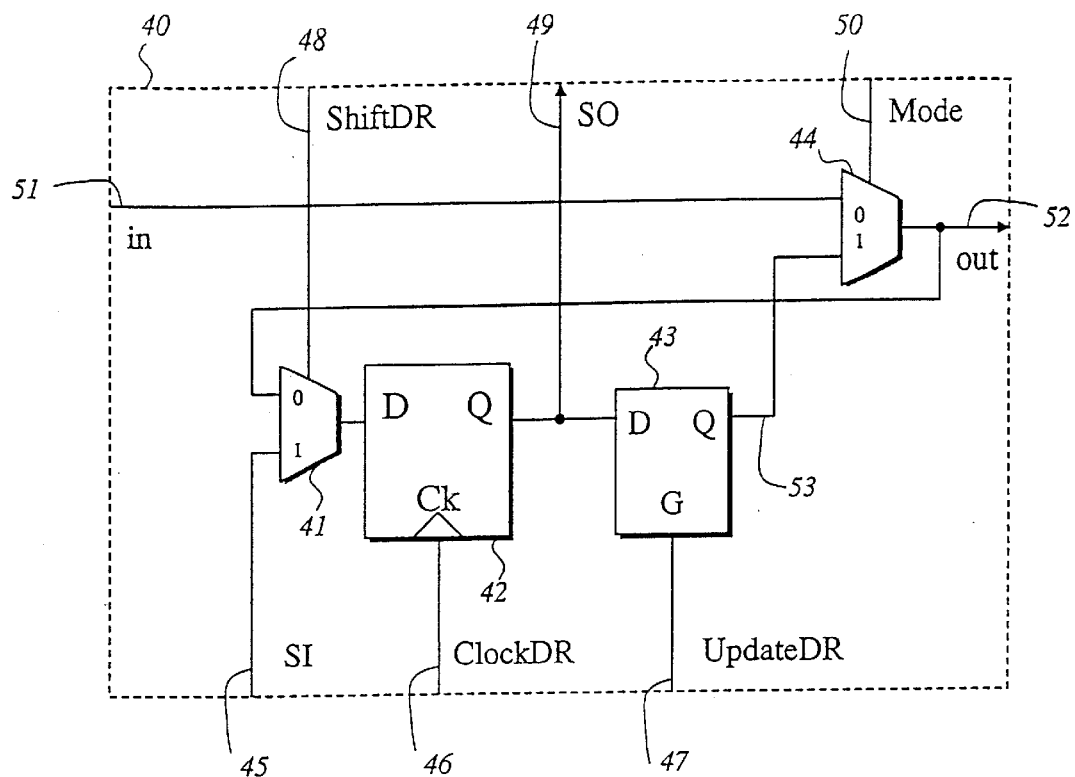
FIG. 3A is a circuit schematic showing a boundary scan cell for an input or an output pin, as described in the IEEE 1149.1 standard.
Figure 3B:
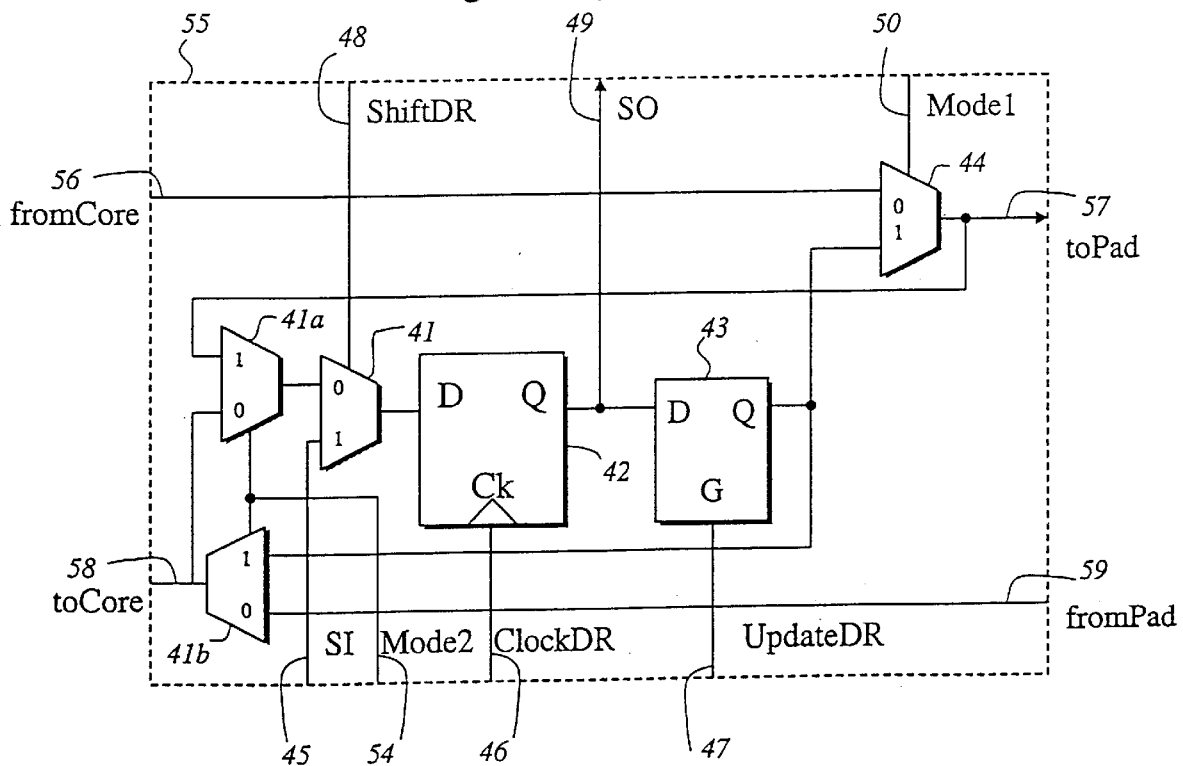
FIG. 3B is a circuit schematic showing a boundary scan cell for a bi-directional pin, as described in the IEEE 1149.1 standard.

Examples of the boundary scan cell 216 are shown in FIGS. 3A and 3B. The boundary scan cell 40 shown in FIG. 3A comprises multiplexers 41, 44, a scan shift register 42 and a parallel output latch 43. The multiplexers 41, 44, a scan shift register 42 and a parallel output latch 43 are respectively controlled by signals ShiftDR 48, Mode 50, ClockDR 42 and UpdateDR 47 generated by the TAP controller 119 (FIG. 2A). The cell 40 receives functional data 51 via the multiplexer 44, and outputs signal 52 from the multiplexer 44.

Figure 4C:
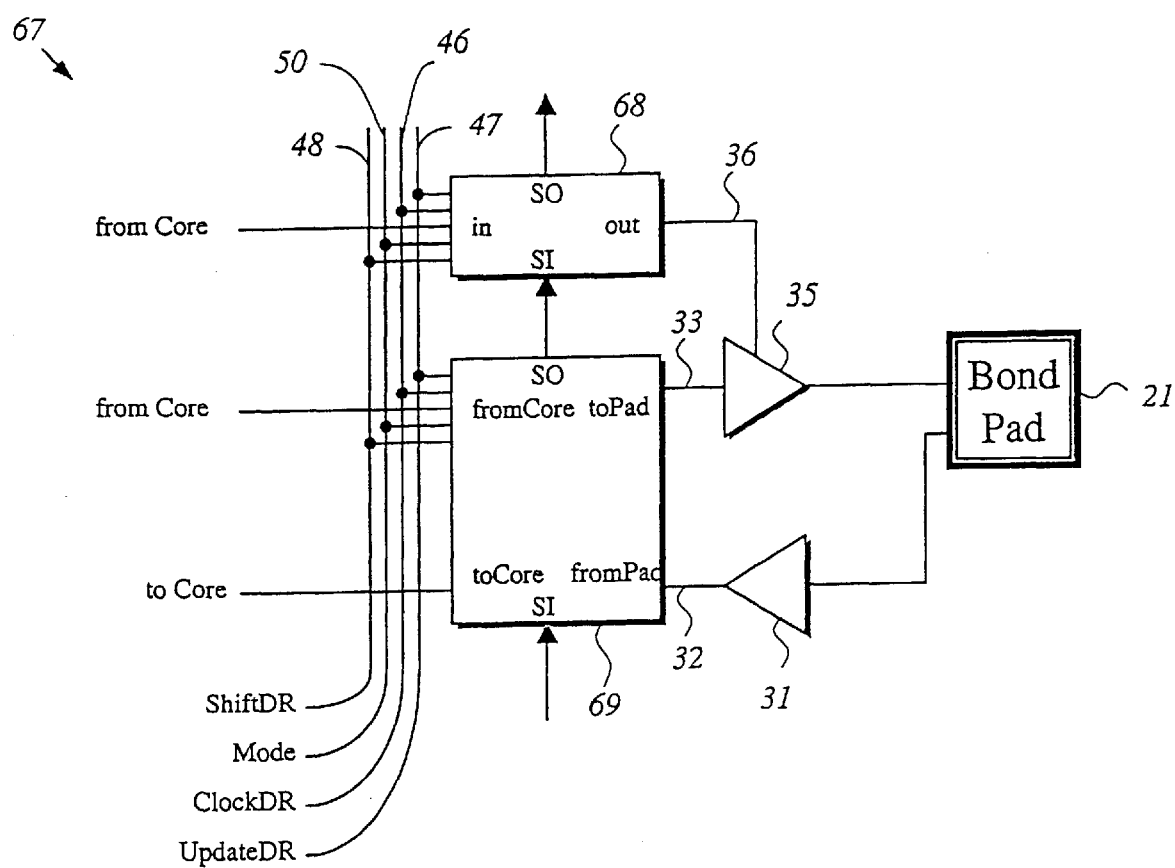
FIG. 4C is a circuit schematic showing a connection between a 3-state bi-directional bond pad and two boundary scan cells, one like that in FIG. 3A and the other like that in FIG. 3B, as compliant with the IEEE 1149.1 standard.

The circuit 55 in FIG. 3B combines the blocks 65 and 66 of the circuit 63 of FIG. 4B into a single boundary scan cell 55 that is connected to a bond pad 21 as shown in the circuit 67 of FIG. 4C. The circuit 67 of FIG. 4C uses the same timing as circuit 60 of FIG. 4A and circuit 63 of FIG. 4B. The circuit 67 conforms to the IEEE 1149.1 standard. The boundary scan cell 55 of FIG. 3B comprises multiplexers 41a and 41b, in addition to those elements included in the boundary scan cell 40 of FIG. 3A. The multiplexers 41a and 41b are controlled by a signal Mode2 54 from the TAP controller 119 (FIG. 2A). The cell 55 receives a signal from the core circuit 202 (FIG. 2A) via the multiplexer 44, and outputs signal 57 to the bond pad 21 from the multiplexer 44. Also, the cell 55 receives a signal from the bond pad 21 via the multiplexer 41b, and outputs signal 58 to the core circuit 202 from the multiplexer 41b.

Similarly, to facilitate testing of leakage current at a 3-state output bond pad 21, the on-chip test circuitry connected to the bond pad 21 may be re-designed as shown in FIG. 2 and FIG. 4A, in which it is shown how an input buffer 31 is also connected to the bond pad 21.

Bi-directional bond pads, which already comprise a 3-state output driver and input buffer, might not need any circuit changes, or might only need boundary scan cells 64–66, 68–69 added as shown in FIG. 4B and FIG. 4C.

Figure 5A:
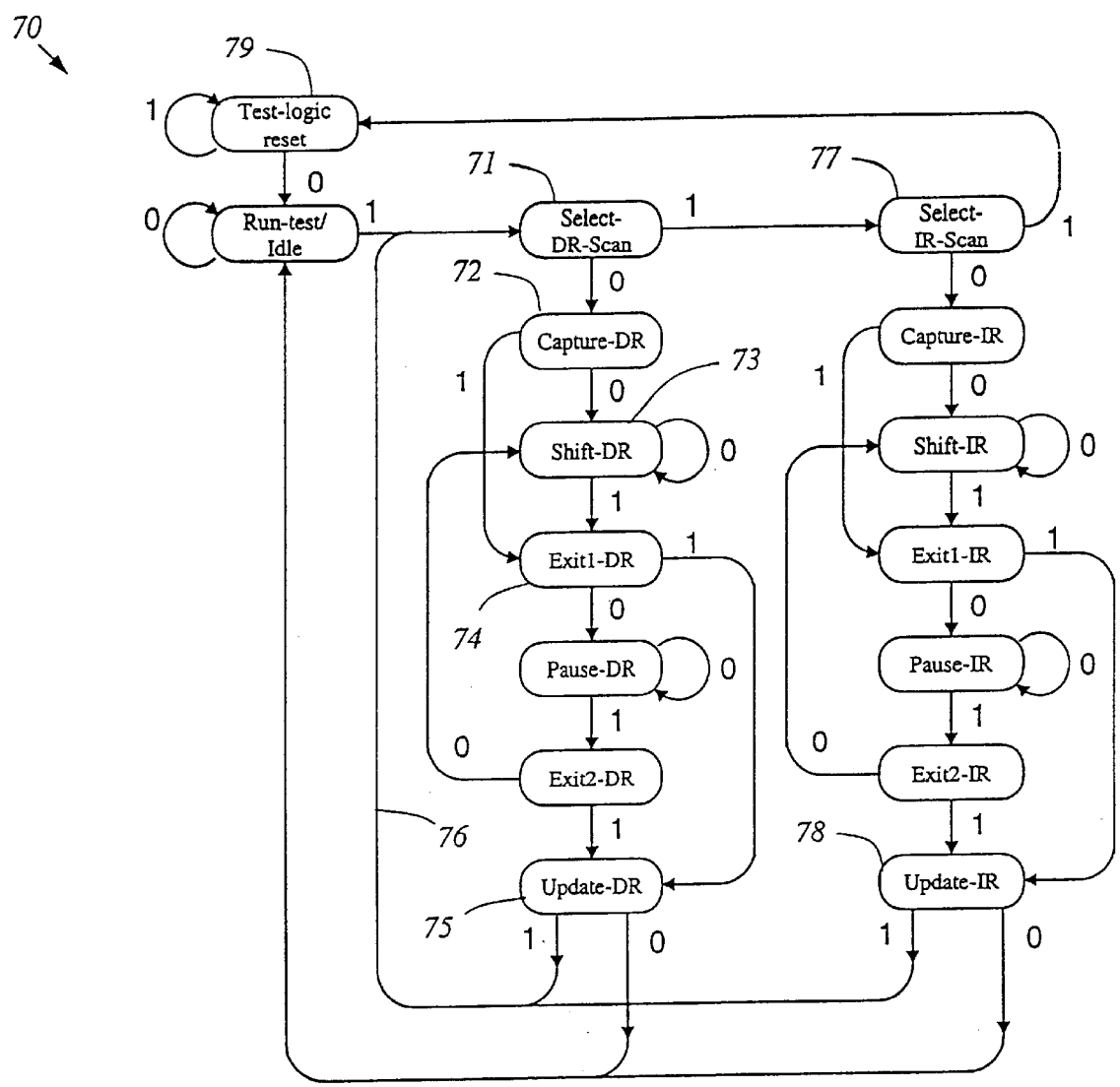
FIG. 5A is a state diagram for the TAP controller described in the IEEE 1149.1 standard.

The TAP controller 119 shown in FIG. 2A is used to control boundary scan cells 216 according to the IEEE 1149.1 standard. The state diagram for the TAP controller 119 is shown in FIG. 5A. The TAP controller 119 has 16 different states. Transitions between the 16 different states are controlled by the value of TMS 98 whenever the logic level of TCK 99 has a rising edge. The three major states of the TAP controller 119 are the Capture-DR state 72, Shift-DR state 73 and Update-DR state 75. The Capture-DR state 72 loads data or instruction bits in parallel into the test registers in the boundary cells 216. The Shift-DR state 73 moves the captured data or instructions out through TDO 112 and simultaneously allows new data or instruction to be shifted in through TDI 111. The Update-DR state 75 causes the newly shifted data to be latched onto the parallel outputs of the selected test register.

Figure 5B:
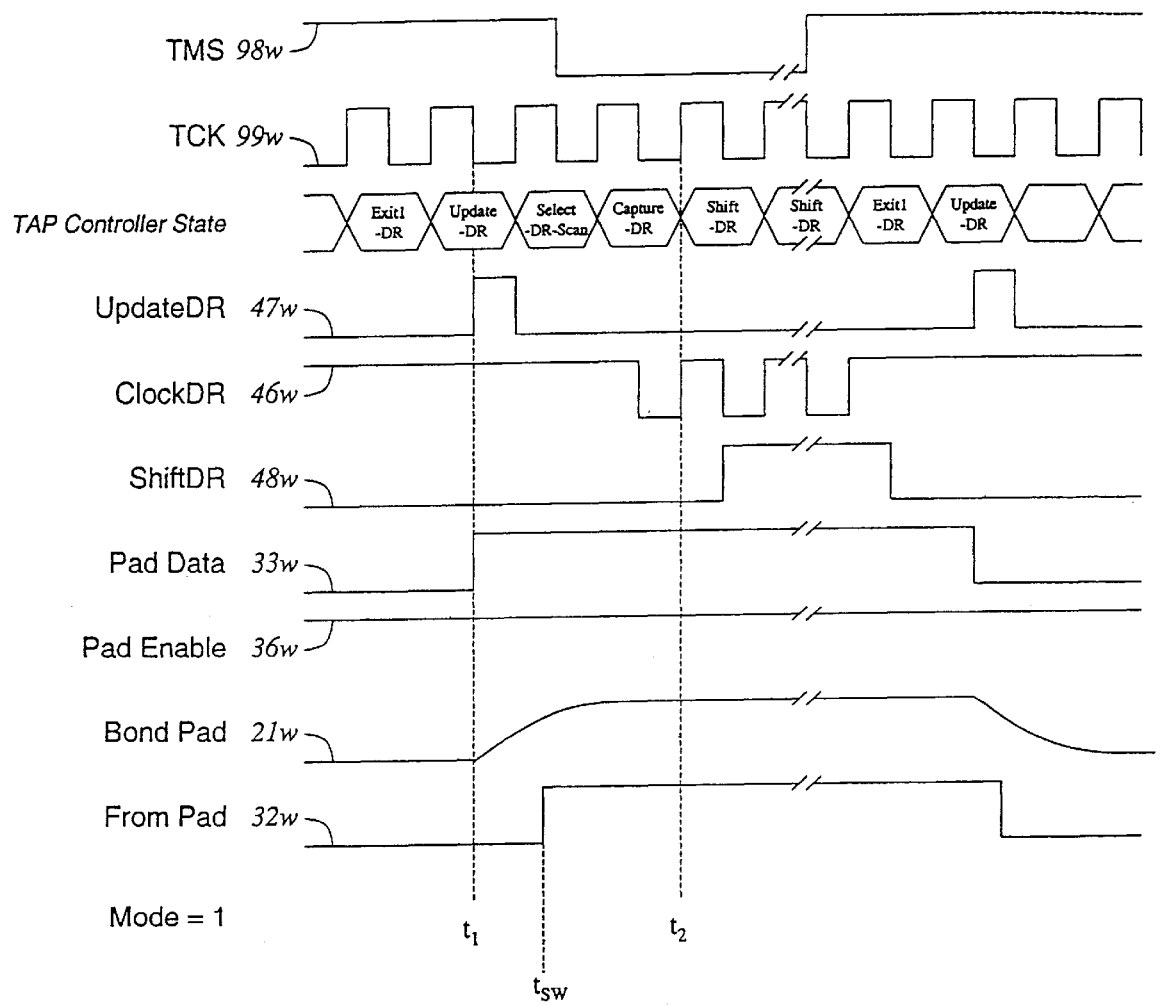
FIG. 5B is a chart showing typical waveforms for some nodes of the circuits in FIG. 4A, FIG. 4B, and FIG. 4C when driven by a TAP controller having the states shown in FIG. 5A.

Some typical waveforms for the circuits in FIG. 4A, FIG. 4B, and FIG. 4C are shown in FIG. 5B, where waveforms 47w, 46w, 48w, 33w, 36w, and 21w are for the circuit nodes 47, 46, 48, 33, 36, and 21 respectively. A test clock waveform 99w is shown in FIG. 5B. The test clock signal TCK 99 would typically be supplied by the tester and would be used to generate the waveforms of FIG. 5B using prior art TAP controller 119 which drives many boundary scan cells 216. To be consistent with the IEEE 1149.1 standard, the UpdateDR signal 47 shown in FIG. 3A and FIG. 3B causes data in the scan shift register 42 to be transferred to parallel output latches 43, the ClockDR signal 46 clocks the scan shift register 42, the ShiftDR signal 48 selects scan data 45 or another signal, and Mode 50 selects test data 53 or function data 51.

For a bond pad with 1 pF capacitance, the typical maximum leakage current of 1 $\mu$A would discharge the bond pad voltage by 1 volt in 1 $\mu$s, which corresponds to 2½ clock periods of a 2.5 MHz clock. To test bond pad currents greater than 1 $\mu$A, or with test clock frequencies slower than 2.5 MHz, it is necessary to provide circuitry to sample the logic level of the bond pad 21 sooner than the state diagram of FIG. 5A permits. According to the state diagram of FIG. 5A: during the Update-DR state 75, an update occurs coincident with the falling edge of TCK 99; when TCK 99 next rises and TMS=1 the TAP controller 119 enters the Select-DR-Scan state 71; then, when TCK 99 next rises and TMS=0 the TAP controller 119 enters the Capture-DR state 72, and the capture action takes place on the following rising edge of TCK 99. Hence, a minimum of 2½ periods of the TCK clock is required between an update (at time $t_1$, in FIG. 5B) and a capture (at time $t_2$ in FIG. 5B). This interval corresponds to 1 $\mu$s for a 2.5 MHz test clock.

Figure 6A:
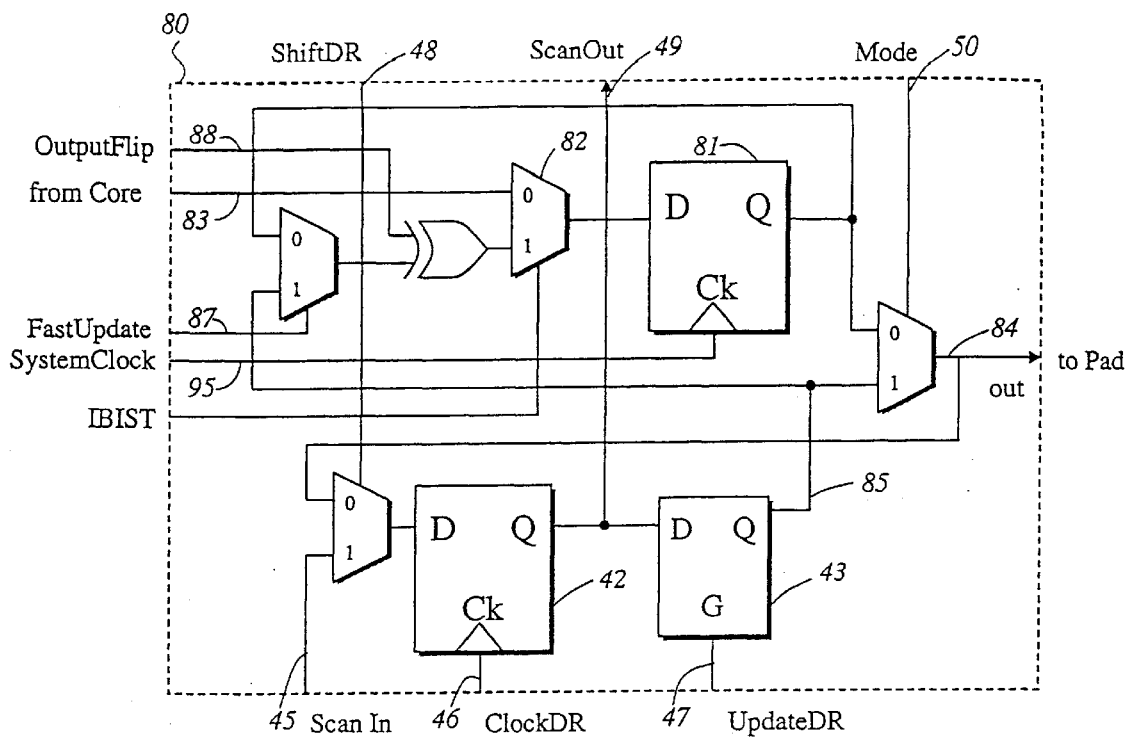
FIG. 6A is a circuit schematic showing a boundary scan cell for an output bond pad, for high speed generation of test signals, according to U.S. Pat. No. 6,000,051 issued to Nadeau-Dostie and Coté on Dec. 7, 1999.
Figure 6B:
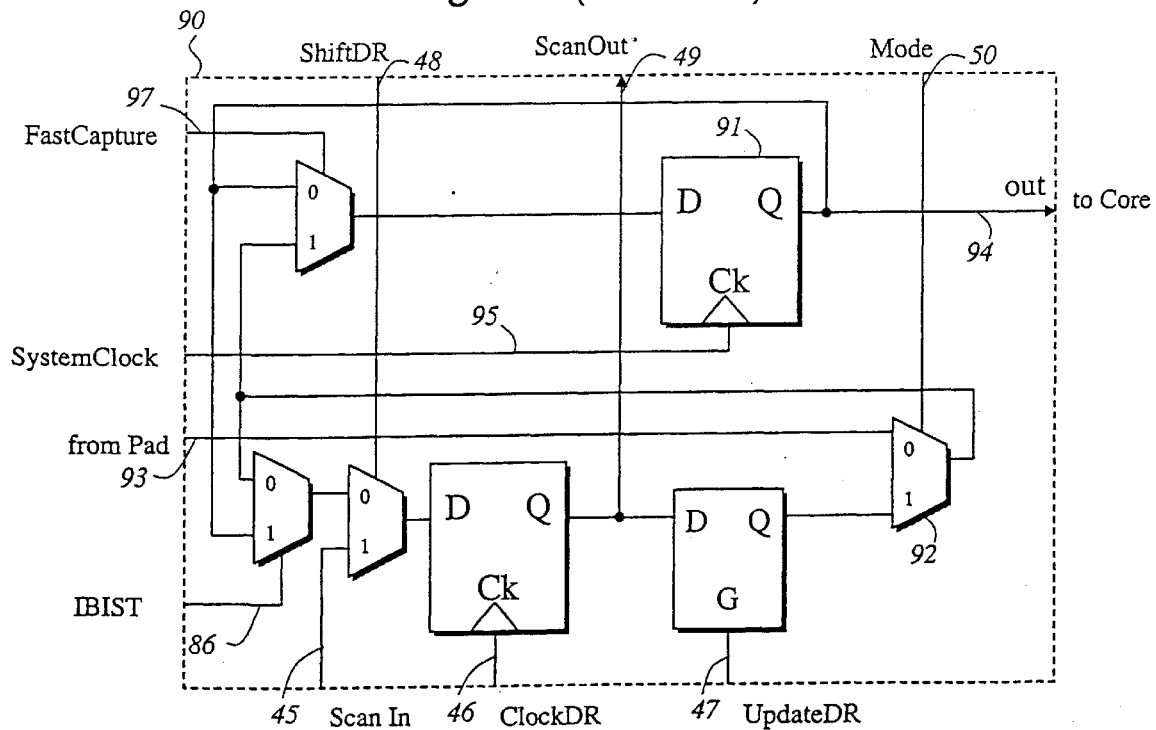
FIG. 6B is a circuit schematic showing a boundary scan cell for an input bond pad, for high speed sampling of test signals, according to the patent by Coté et al.
Figure 6C:
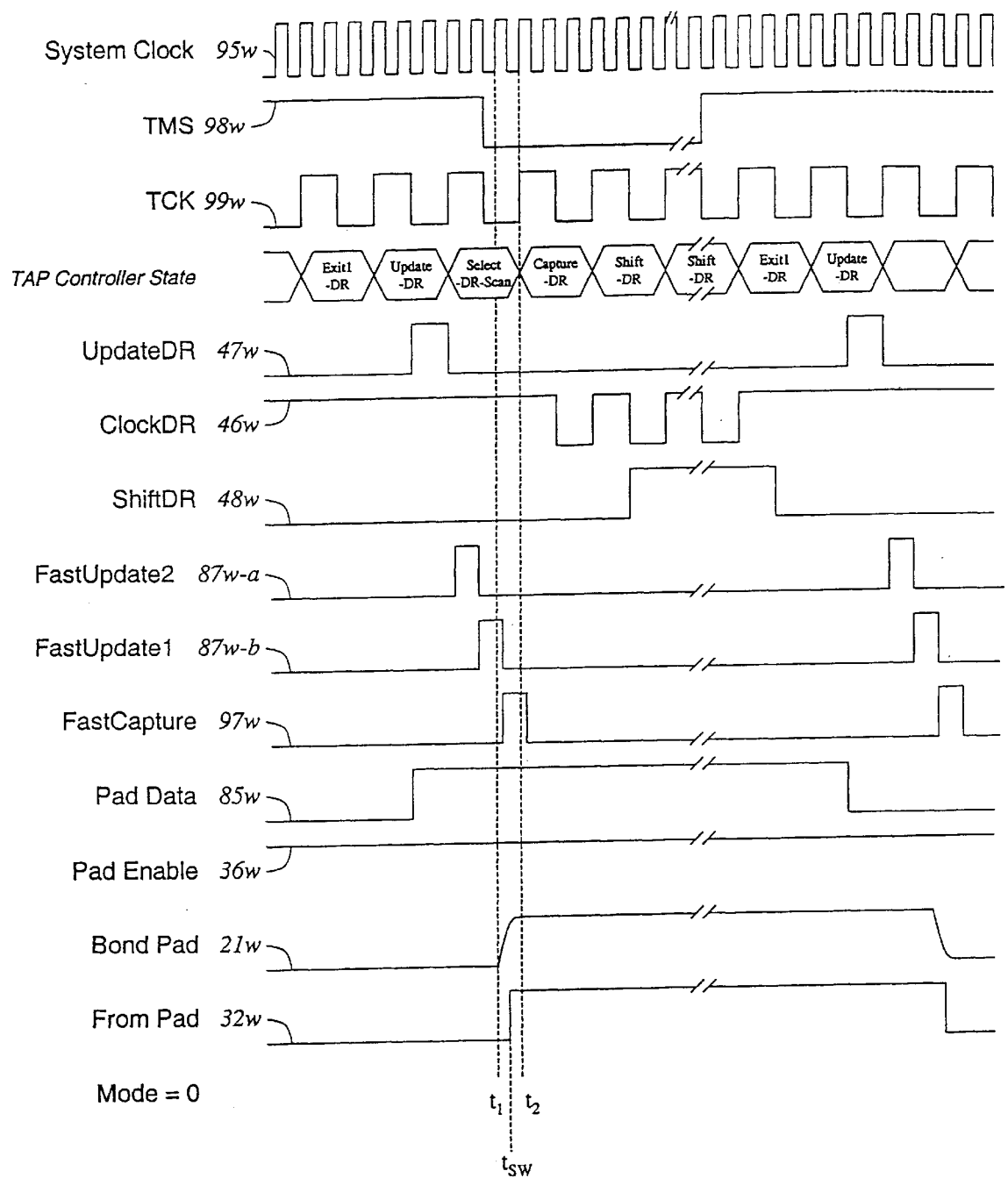
FIG. 6C is a chart showing typical waveforms for some nodes of the circuits in FIG. 6A and FIG. 6B.

FIG. 6A and FIG. 6B show prior art circuits 80 and 90 according to U.S. Pat. No. 5,815,043 issued to Cote et al on Sep. 29, 1998. The circuit 80 permits sampling the logic level of a bond pad 21, one system clock cycle after the time at which a transition is initiated at the pad using the circuit 90. With circuits 80 and 90 connected to the bond pad 21, for a 100 MHz system clock frequency, it is possible to sample 10 ns after initiating a transition, regardless of the test clock frequency. Although the primary objective of the circuits 80 and 90 is to test the signal propagation delay through off-chip wires connected between pins having this circuitry, the present invention can use the circuits 80 and 90 to test bond pad parameters during wafer-level or packaged device testing. The circuits 80 and 90 and the method of the patent by Cote et al require additional signals IBIST 86, FastUpdate 87, OutputFlip 88, SystemClock 95 and. FastCapture 97 to be distributed to all boundary scan cells, require logic gates to be added to each 3-state bi-directional boundary scan cell, and require all bond pads to be bi-directional if they are to be tested according to the present invention. Some typical waveforms of circuit nodes in circuits 80 and 90 are shown in FIG. 6C (using the same labelling syntax as in FIG. 5B). In FIG. 6C, the two times relevant to the present invention are time $t_1$, when a logic transition is applied to a bond pad 21 connected to the output 84 of circuit 80, and time $t_2$, when the logic signal 93 from the bond pad is sampled by circuit 90.

Figure 7A:
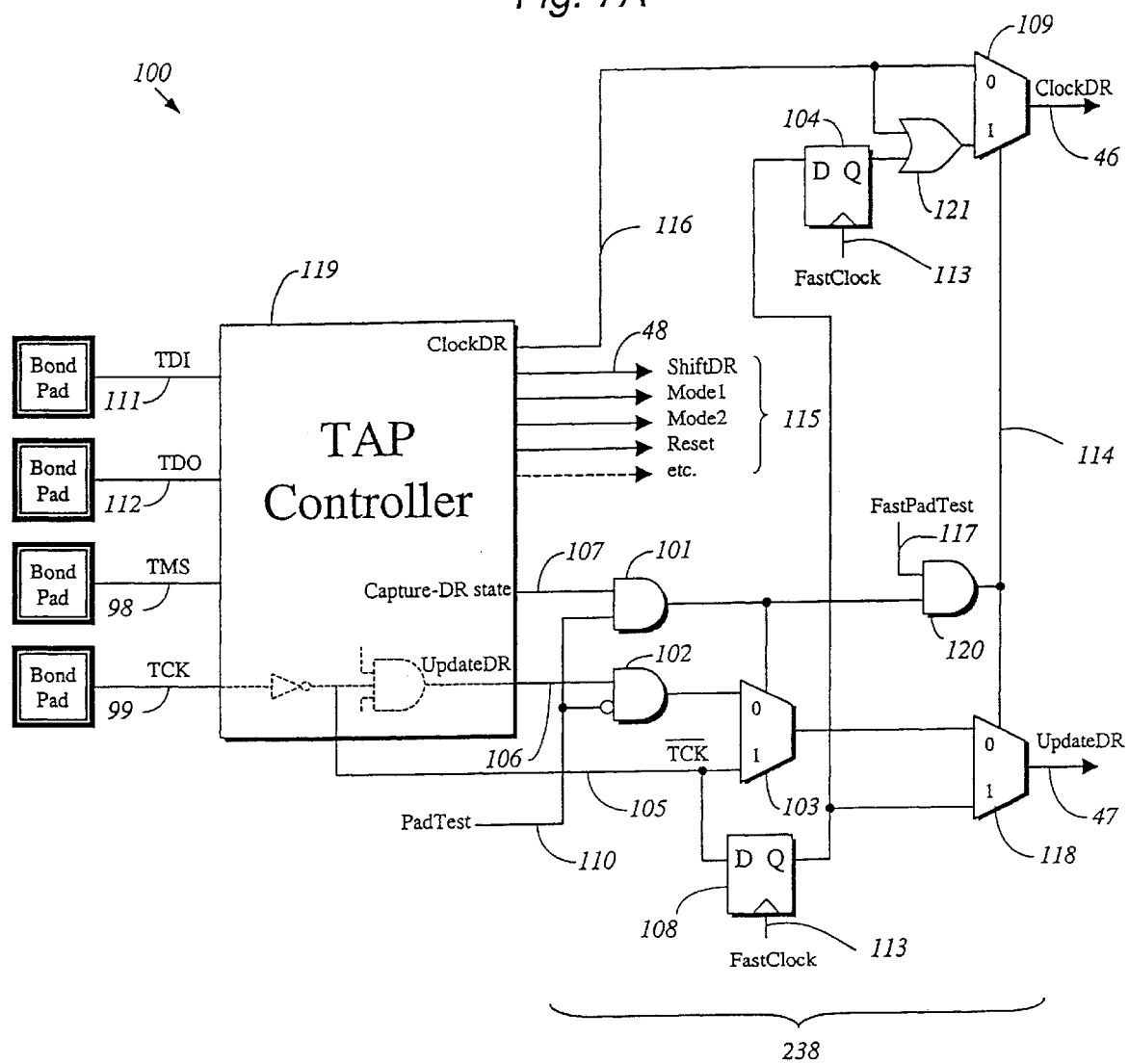
FIG. 7A is a circuit schematic showing how a TAP controller, having the state diagram of FIG. 5A, can be modified according to the present invention to generate a reduced Update-Capture time interval for boundary scan cells constructed according to the prior art.
Figure 7B:
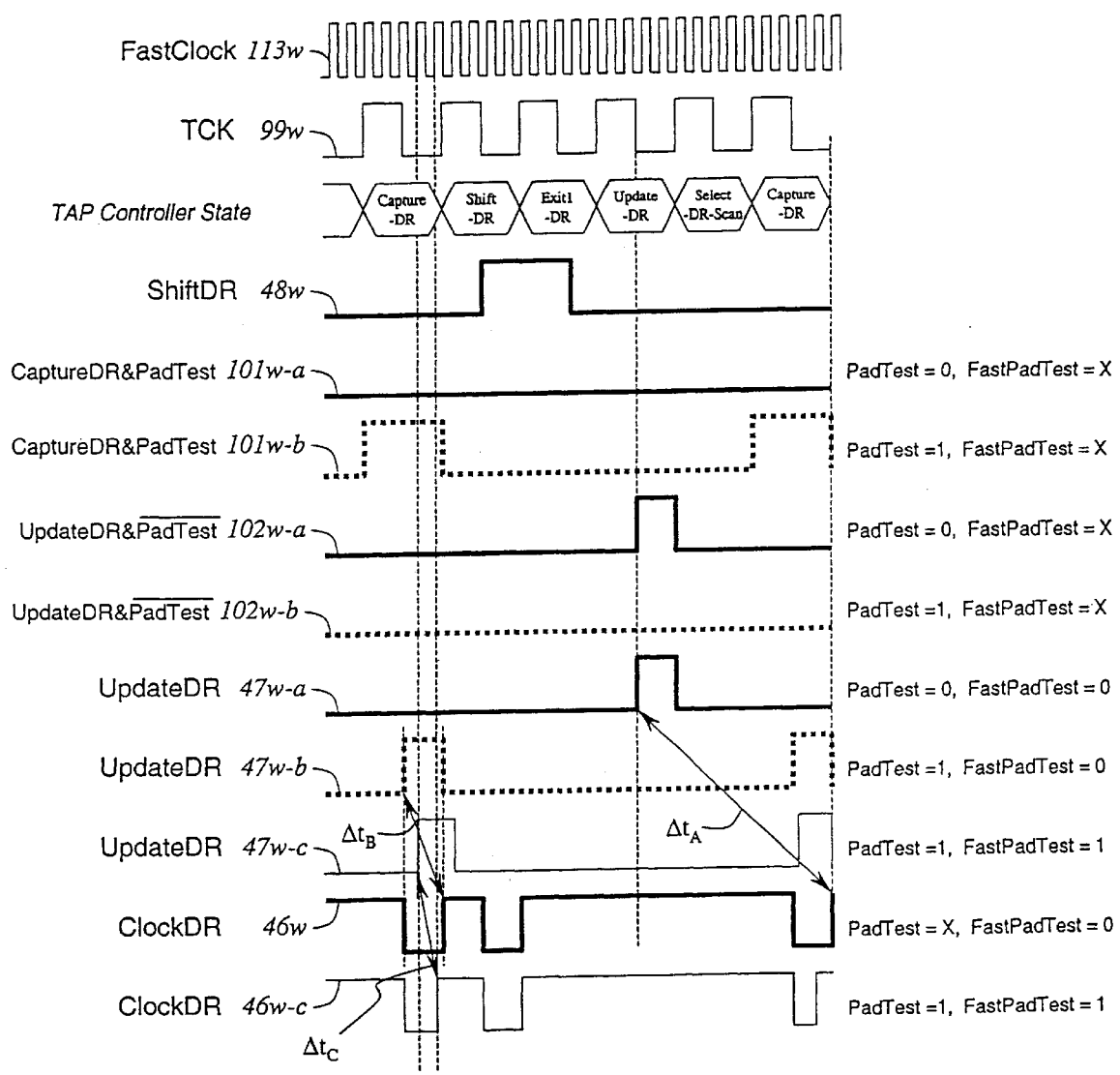
FIG. 7B is a chart showing waveforms for some nodes of the circuit of FIG. 7A when driven by a TAP controller having the states shown in FIG. 5A, for three different modes of operation.
Figure 7C:
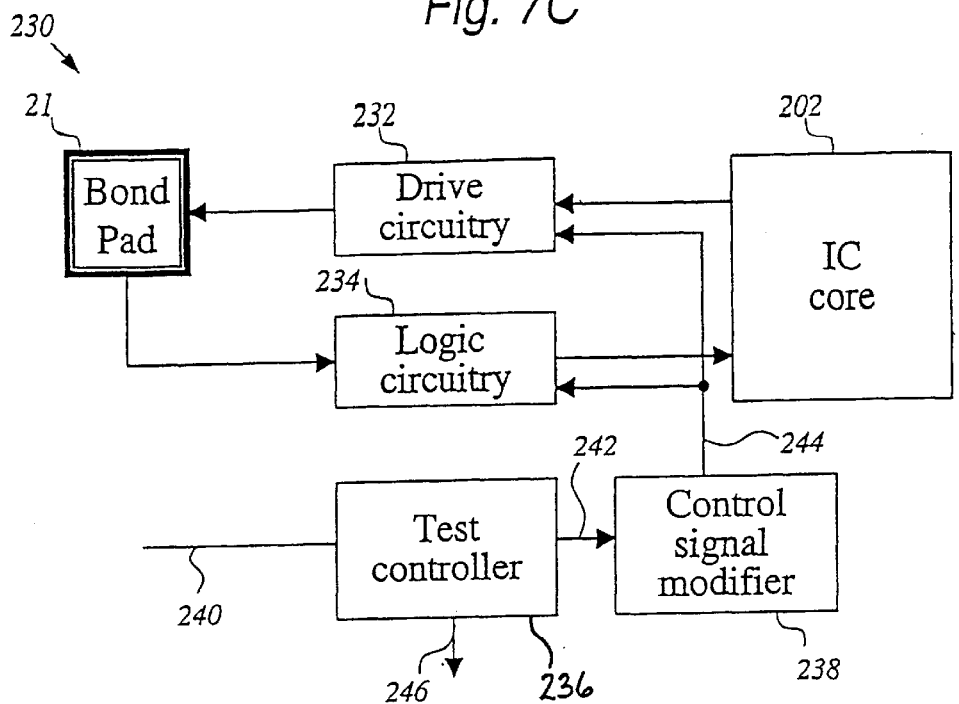
FIG. 7C is a block diagram showing testing circuitry in accordance with an embodiment of the present invention.

FIG. 7C shows a testing circuitry 230 in accordance with an embodiment of the present invention. The testing circuitry 230 is connected to a bond pad 21 and a core circuitry 202 of a circuit under test. The testing circuitry 230 comprises drive circuitry 232, logic circuitry 234, a test controller 236 and a control signal modifier 238.

The drive circuitry 232 is provided to drive the bond pad 21. The logic circuitry 234 is provided to sample the voltage of the bond pad 21. The test controller 236 controls the drive circuitry 232 and the logic circuitry 234. The test controller 236 receives a test input signal 240 and generates a test control signal 242. The control signal modifier 238 modifies the test control signal 242 and generates a modified control signal 244 to the drive circuitry 232 and the logic circuitry 234. The test controller 236 also receives the sampled result from the logic circuitry 234 and generates a test result 246.

Figure 7D:
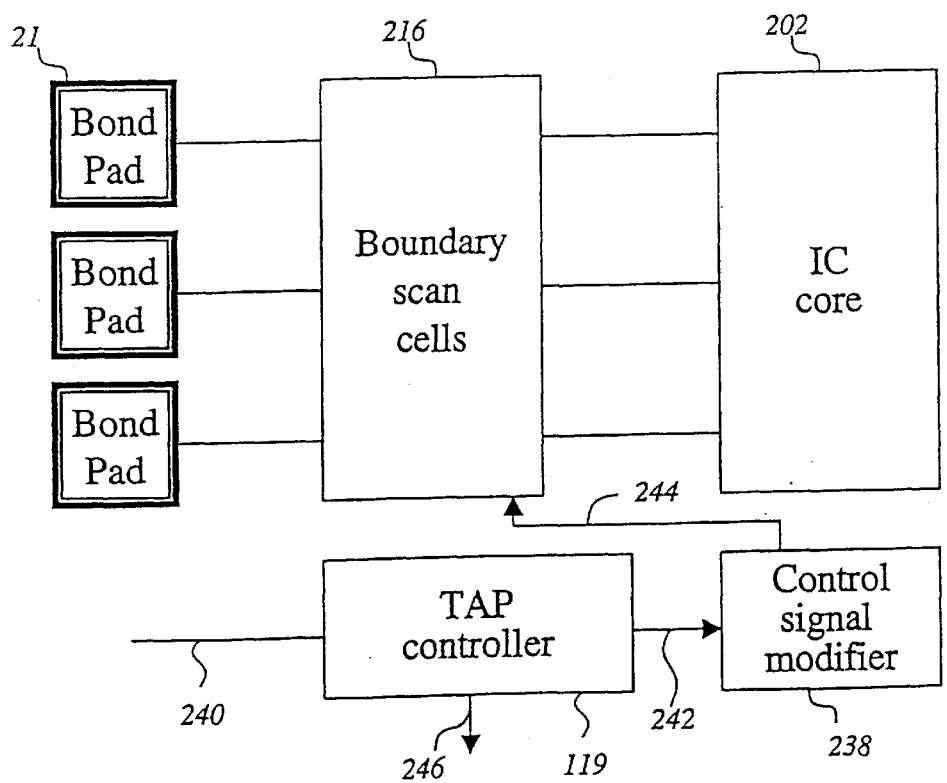
FIG. 7D is a block diagram showing testing circuitry in accordance with an embodiment of the present invention using a TAP controller having the state diagram of FIG. 5A.

The present invention allows the use of existing or known circuitry for the drive circuitry 232, logic circuitry 234 and a test controller 236. FIG. 7D shows testing circuitry 100 which uses an IEEE 1149.1 TAP controller 119 and boundary scan cells 216 having the drive circuitry and the logic circuitry. The control signals from the TAP controller 119 are modified by a control signal modifier 238. FIG. 7A shows details of the control signal modifier 238 together with the TAP controller 119. The modified 1149.1 TAP controller circuit 100 enables testing according to the present invention but does not require additional signals to be distributed to boundary scan cells 216.

The control signal modifier 238 receives from the TAP controller 119 some of the control signals including UpdateDR signal 106, Capture-DR state signal 107 and ClockDR 116. The modifier 238 also receives PadTest signal 110 and FastClock 113. The modifier 218 modifies these signals and generates timing intervals between edges of UpdateDR 47 and CaptureDR 46 that can be much shorter than 2½ periods of the TCK clock, as is shown in the waveforms of FIG. 7B.

The control signal modifier 238 comprises AND gates 101, 102, 120, multiplexers 103, 109, 118, flip-flops 104, 108 and an OR gate 121. The AND gate 101 receives the PadTest signal 110 and Capture-DR state signal 107. The AND gate 102 receives the UpdateDR signal 106 and inverted PadTest signal 110. The output of the AND gate 102 and an inverted TCK 105 are input to the multiplexer 103 which is controlled by the output of the AND gate 101. The inverted TCK 105 is also input to the flip-flop 108 controlled by the FastClock 113. The output of the flip-flop 108 is input to the multiplexer 118 and the flip-flop 104 which is also controlled by the FastClock 113. The AND gate 120 receives the output of the AND date 101 and the FastPadTest signal 117. The multiplexer 118 also receives the output of the multiplexer 103 and outputs the UpdateDR signal 47 under the control of the output of the AND gate 120. The OR gate 121 receives the output of the flip-flop 104 and the ClockDR 116. The multiplexer 109 receives the output of the OR gate 121 and the ClockDR 116, and outputs the selectably re-timed ClockDR signal 46 under the control of the output of the AND gate 120.

The circuit 100 has three modes of operation, controlled by signals PadTest 110 and FastPadTest 117. The signals PadTest 110 and FastPadTest 117 are outputs of two register bits, for example, whose values are scanned in through the TAP. The registers may be part of the Instruction Register (not shown) or part of the chain of the boundary scan cells 216, and are reset when the TAP controller 119 enters the Test-logic-reset state 79 (in FIG. 5A).

When PadTest=0, regardless of the value of FastPadTest 117, the circuit 100 functions as a conventional IEEE 1149.1 TAP controller 119. In this case, the PadTest signal 110 forces the output of AND gates 101 and 117 to logic 0 which routes the UpdateDR signal 106 directly through AND gate 102 and multiplexers 103 and 118, and routes ClockDR signal 116 directly through multiplexer 109. The 2½ periods of TCK time interval from the leading edge of the UpdateDR signal 47w-a to the next rising edge of the ClockDR signal 46w is shown as $\Delta t_A$.

When PadTest=1 and FastPadTest=0, the circuit 100 reduces the update-to-capture time interval to one half period of the TCK clock, for conventional boundary scan cells. In this case, the PadTest signal 110 introduces an UpdateDR pulse 47 by routing an inverted TCK signal 105 through multiplexer 103 whenever the TAP controller is in the Capture-DR state 72 (FIG. 5A) as indicated by signal 107 being 1. Subsequent to the Capture-DR state 72, the UpdateDR pulse 106 produced by the prior art TAP controller 119 is not routed to the output UpdateDR signal 47 during the Update-DR state 75. The timing for the ClockDR signal 46w is unchanged relative to the prior art TAP controller 119. Thus, in this new mode, an update-capture is performed during the Capture-DR state 72, and no update is performed during the Update-DR state 75. The update-to-capture time interval from the leading edge of the UpdateDR signal 47w-b to the next rising edge of the ClockDR signal 46w is shown as $\Delta t_B$ in FIG. 7B. $\Delta t_B$ is one half period of the test clock TCK 99, and shorter than $\Delta t_A$.

When PadTest=1 and FastPadTest=1, the circuit 100 further reduces the update-to-capture time interval to one period of clock 113 which is preferably a high speed test clock generated on-chip with programmable clock period. In this case, during the Capture-DR state 72, the FastPadTest signal 117 selects re-timed versions of the signals UpdateDR 106 and ClockDR 116, via multiplexers 118 and 109, respectively. Rising edges of the inverted TCK signal 105 are delayed by a flip-flop 108 to produce rising transitions coincident with rising edges of the high speed clock signal 113; one rising edge is routed through multiplexer 118 during the Capture-DR state 72. The UpdateDR signal 47w-c returns to zero at the end of the Capture-DR state 72. During the Capture-DR state, the rising edge of the ClockDR signal 46w-c is advanced by a flip-flop 104 to occur one high speed clock cycle 113 after the UpdateDR rising edge. In this mode, an update-capture is performed during the Capture-DR state 72, and no update is performed during the Update-DR state 75. The update-to-capture time interval is shown as $\Delta t_C$ in FIG. 7B. $\Delta t_C$ is one period of the first clock 113 and shorter than $\Delta t_A$ and $\Delta t_B$.

In summary, the prior art TAP controller 119 with state diagram 70 shown in FIG. 5A and boundary scan cells 40 or 55 (FIGS. 3A, 3B) can be used to implement an update-to-capture interval of 2½ periods of the test clock TCK 99. Prior art boundary scan cells 40 or 55, and the modified TAP controller 100 can be used to implement an update-to-capture interval of one half period of the test clock TCK 99, or one period of a high speed test clock 113. The prior art boundary scan cells 80 and 90 (FIGS. 6A, 6B) and the TAP controller 119 in the US patent by Cote et al can be used to implement an update-to-capture interval of one period of the system clock 95. Depending on the clock frequencies and boundary scan cells available, the testing circuitry 100 described above herein can implement update-to-capture time intervals ranging from many microseconds to several nanoseconds.

Method for Testing DC Parameters of Circuit Nodes

Figure 8:
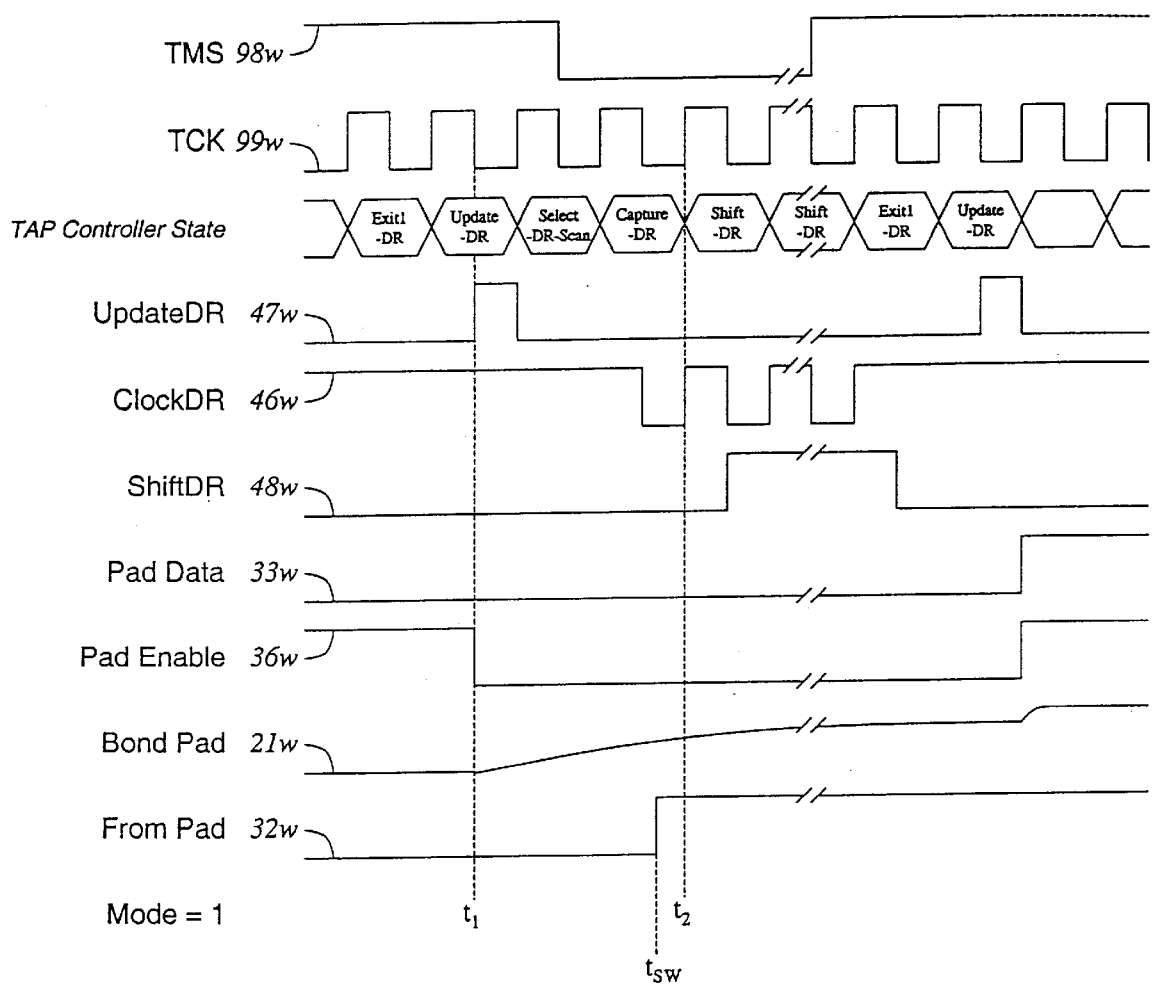
FIG. 8, is a chart showing waveforms for the prior art circuits in FIG. 4B and FIG. 4C when testing input leakage according to the method of the present invention.
Figure 8A:
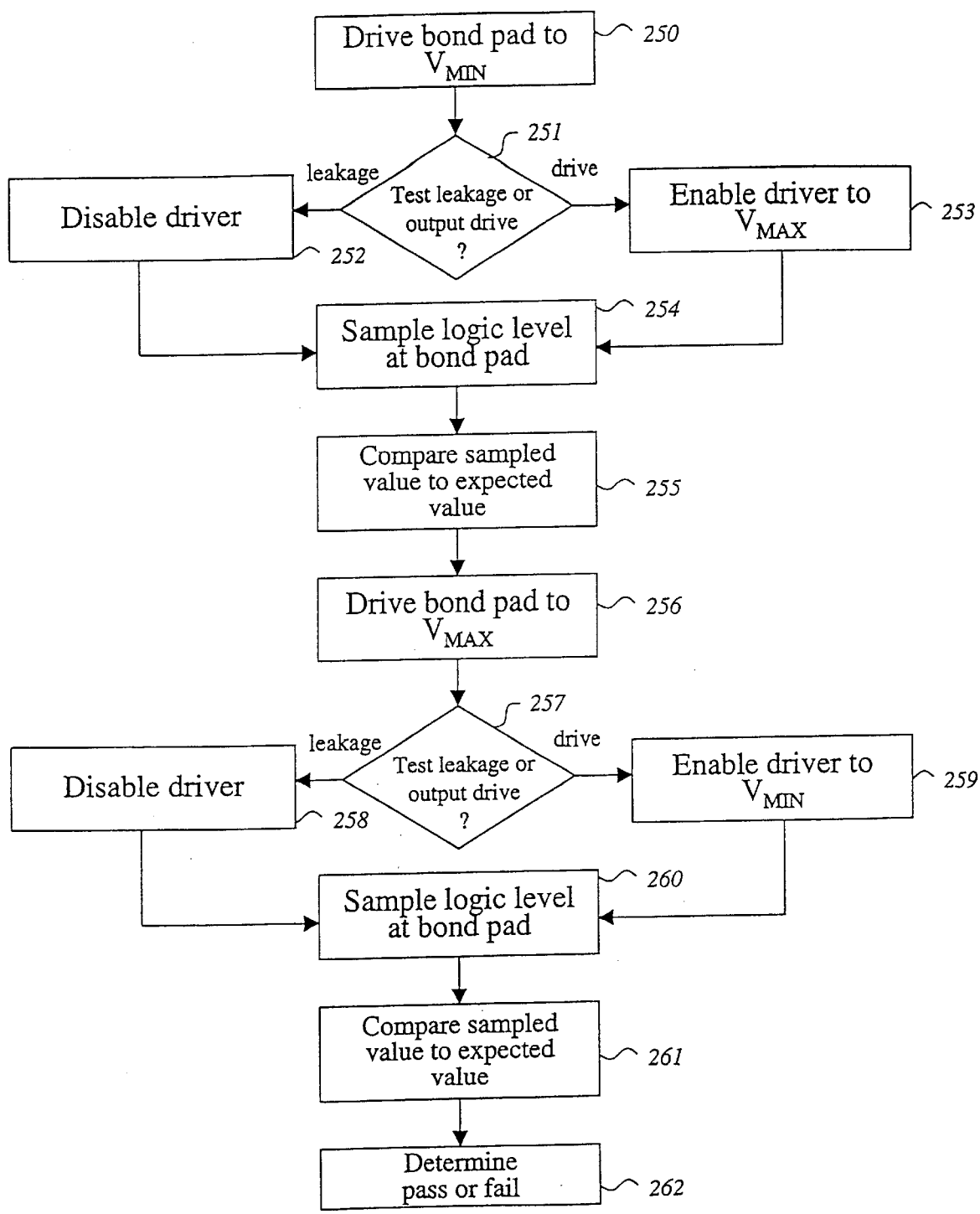
FIG. 8A is a flowchart showing a method for testing a bond pad in accordance with an embodiment of the present invention.

FIG. 8A shows a method for testing current at a bond pad in accordance with an embodiment of the present invention. The bond pad is driven to its minimum voltage by the means for driving the bond pad (250). If leakage current is to be tested (251), the means for driving the bond pad is disabled (252). If output drive is to be tested (251), the means for driving the bond pad is enabled to drive to its maximum voltage (253). After either action, the bond pad voltage increases or stays constant, depending on the magnitude and direction of current flow.

After a pre-determined time interval which is less than the expected transition duration, the logic level at the bond pad is sampled (254). The predetermined time interval is proportional to values of the capacitance of the circuit node, the input switching point voltage of the logic circuit, and the current flowing through the circuit node. Optionally, the sample value is shifted out of the IC via the test register. The sampled value is compared to an expected value (255).

Steps 250–255 are repeated to determine current flowing in the opposite direction. That is, the bond pad is driven to its maximum voltage (256) and the means for driving the bond pad drives to its minimum voltage (259). The step 258 corresponds to step 252. Afterwards the bond pad voltage might decrease instead of increasing. Similarly to steps 254 and 255, the logic level at the bond pad is sampled (260) and the sampled value is compared to an expected value (261). Based on the comparison results at steps 255 and 261, passing or failing of the bond pad is determined (262).

Optionally, the steps 250–261 may be repeated with different time intervals to determine the magnitude of the current. Also, steps 250–261 repeated for different time intervals may be repeated with a known capacitance connected to the bond pad, to enable testing larger current magnitudes. Further more, these steps may be optionally repeated with a known resistance connected between the bond pad and a power supply, to increase the test accuracy for larger current magnitudes by use of comparison, or to test the input switching point voltage.

The order of driving the bond pad to its minimum voltage and to its maximum voltage may be reversed.

Method for Testing Leakage Current Into or Out of a Bond Pad with Known Capacitance and Switching Point Voltage The method for testing output current for a pin or bond pad will be described referring to the waveforms in FIG. 8. The method uses the circuitry shown in FIGS. 4A, 4B, 6A and 6B of the prior art or the modified circuitry shown in FIG. 7A according to the embodiment of the present invention.

At some time $t_0$, (not shown), before $t_1$, the bond pad 21 is driven to its minimum voltage, $V_{SS}$, by a bond pad 3-state driver 35 whose data input is controlled by a latch 43 in the test register in the boundary scan cell, e.g., the cell 40 shown in FIG. 3A.

At time $t_1$, the bond pad driver 35 is disabled by its enabling signal 36w from a boundary scan cell, which forces the output of the bond pad driver 35 to a high impedance state.

Immediately after time $t_1$, the bond pad voltage is no longer driven by the 3-state driver, and so the voltage increases if there is a (positive) leakage current charging the bond pad capacitance, as shown in waveform 21w. The voltage will stay constant if there is no leakage current or if the leakage current is negative.

For positive leakage current, at pre-determined time $t_2$, after $t_1$, the output signal 32w of the input buffer 31 connected to the bond pad 21 is sampled, and optionally the sample value is shifted out of the IC via the test register in the boundary scan cell. Time $t_2$ is pre-determined such that the value sampled depends upon whether a transition is too slow or too fast, and is thus dependent on the current flowing. If the current $I_{PAD}$ charges the bond pad voltage sufficiently between $t_1$ and $t_2$, the input buffer 31 will change state from logic 0 to logic 1 as shown in waveform 32w, assuming a non-inverting buffer. The exact time $t_{SW}$ that the input buffer 31 changes state will depend upon the current $I_{PAD}$, the total bond pad capacitance $C_{PAD}$, and the switching point voltage $V_{SW}$ of the input buffer 31, according to Equation 1 (assuming $I_{PAD}$ is constant), where $\Delta t = t_{SW} - t_1$ and $\Delta V = V_{SW} - V_{SS}$.

$$\Delta t = C_{PAD} \Delta V / I_{PAD} \quad \text{(Equation 1)}$$

For an unpackaged IC, typical values for the variables in Equation 1 are, $C_{PAD}=1$ pF, and $\Delta V=1.5$ volts. $C_{PAD}$ includes the input capacitance of the logic input buffer 31 and any other connected circuitry, for example, pull-up or pull-down circuits 15–18 as shown in FIG. 1. When leakage current is being tested, $I_{PAD}$ is typically less than 1 $\mu$A, for which $\Delta t$ will be greater than 1.5 $\mu$s when no pull-up circuit 15, 17 or pull-down circuit 16, 18 exists. If a pull-up or pull-down circuit 15–18 is connected to the bond pad 21, $I_{PAD}$ is typically between 10 $\mu$A and 150 $\mu$A, and $\Delta t$ is correspondingly between 150 ns and 10 ns. Therefore, if $\Delta t$ is pre-determined to be less than 150 ns, it serves as a test for the presence of a pull-up circuit 15, 17. If the value latched at time $t_2=t_1+150$ ns is a logic 0, then no pull-up circuit 15, 17 is connected to the bond pad; if the value latched is a logic 1, then the existence of a pull-up circuit 15, 17 is verified.

For testing that $\Delta t=150$ ns, with IEEE 1149.1 boundary scan cell, such as that in FIG. 3A and FIG. 3B, the TCK clock period is 150 ns÷2½=60 ns, corresponding to 16.6 MHz. With the modified TAP controller 100 in FIG. 7A, a TCK frequency of 3.3 MHz can generate a half period update-to-capture interval of 150 ns with PadTest=1 and FastPadTest=0. If a 1 MHz clock is used for TCK, then a FastClock 113 frequency of 6.6MHz can generate the 150 ns update-capture interval with PadTest=1 and FastPadTest=1. The boundary scan cells 80, 90 of FIG. 6A and FIG. 6B with their prior art TAP controller 119 can also generate a 150 ns update-to-capture interval when the system clock is 6.6 MHz.

For negative leakage current, the sequence described between $t_0$ and $t_2$ is performed, but instead of driving the bond pad to a minimum voltage at time $t_0$, the bond pad is pulled or driven to a maximum voltage, $V_{DD}$. In this case, Equation 1 still applies, but $\Delta V = V_{DD} - V_{SW}$. If $V_{SW}$ is typically mid-way between $V_{DD}$ and $V_{SS}$, then $(V_{DD} - V_{SW}) = V_{SW} - V_{SS}$.

Generally, if the value latched at time $t_2$ is the same as the logic value at time $t_1$, then the output current is less than the pre-determined value $C_{PAD} \Delta V / (t_2 - t_1)$; if the value latched is different, then the output current is more than the pre-determined value.

Figure 9:
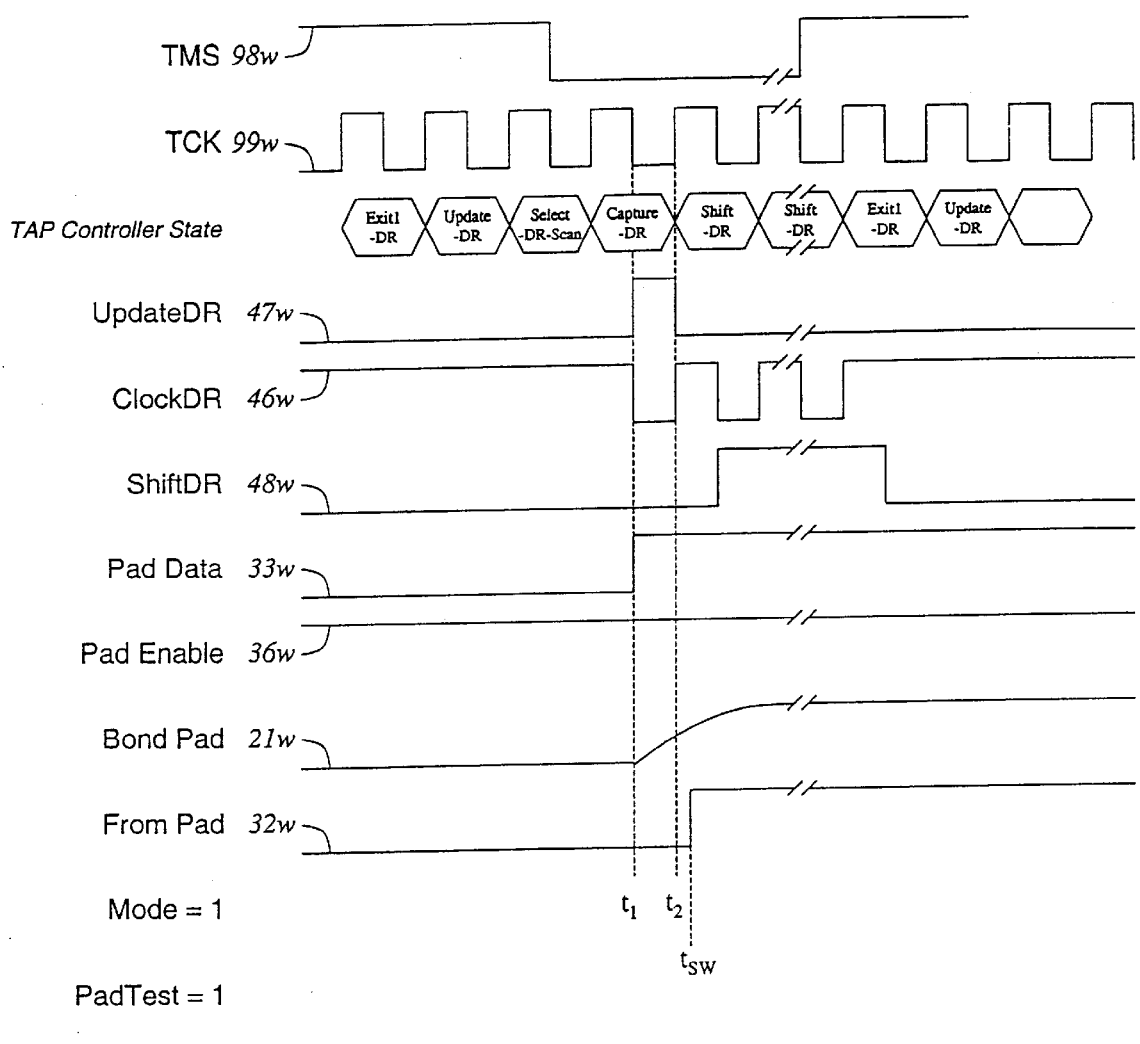
FIG. 9 is a chart showing waveforms for the prior art boundary scan cells, for example those in FIG. 4A, FIG. 4B, and FIG. 4C, when controlled by the modified TAP controller of FIG. 7A and testing output drive current according to the method of the present invention.

Method for Testing Drive Current into or out of a Bond Pad with Known Capacitance and Switching Point Voltage The method for testing output drive current is very similar to the method described for testing leakage current, except that at time $t_1$, the data input to the enabled driver 35 is driven high as seen in the Pad Data waveform 33w of FIG. 9, instead of disabling the driver. The other waveforms in FIG. 9 are for the modified TAP controller circuit 100 with PadTest=1 and FastPadTest=0.

Figure 10:
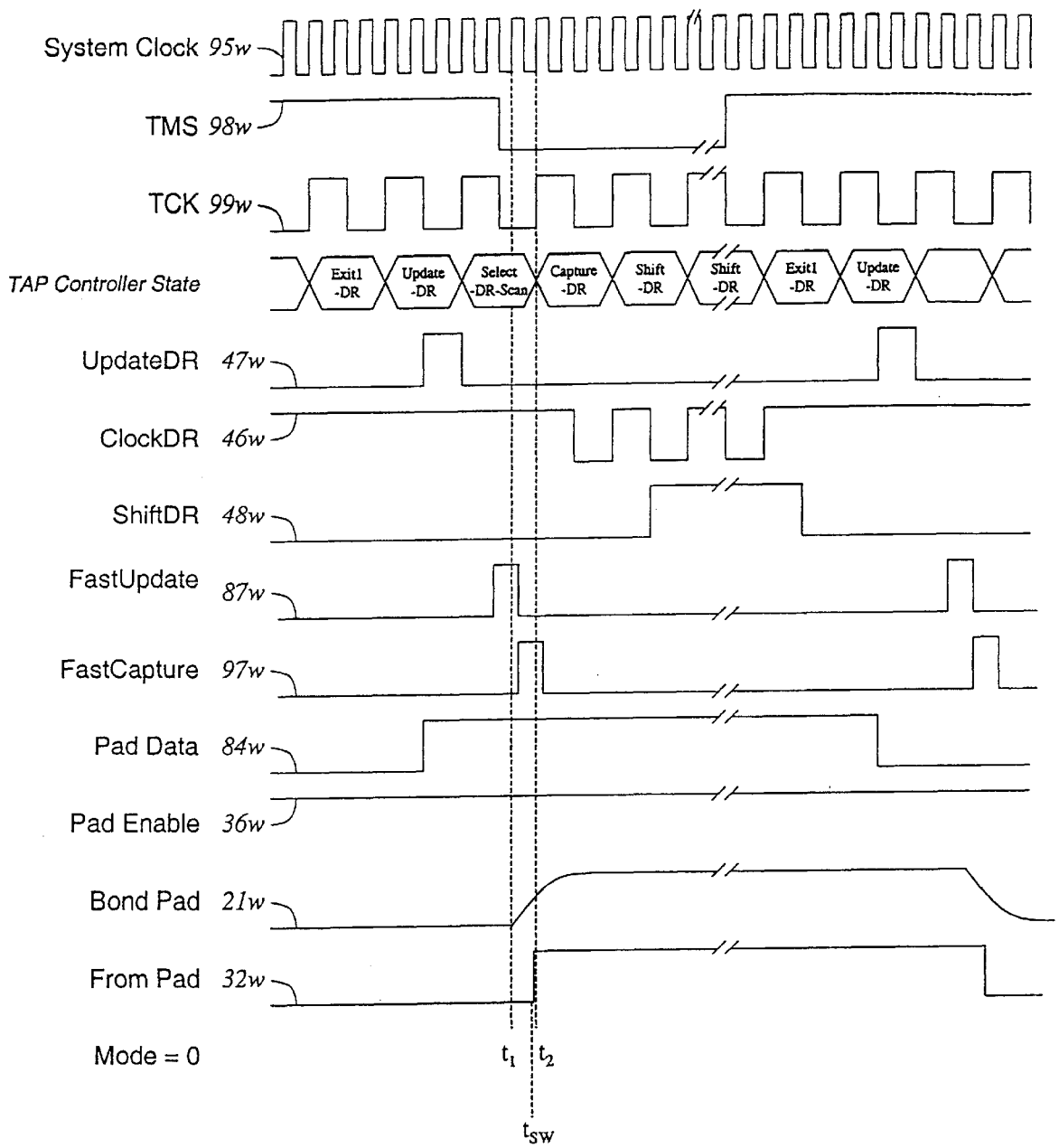
FIG. 10 is a chart showing waveforms for the prior art circuits in FIG. 6A and FIG. 6B when testing output drive current according to the method of the present invention.

When output drive current is being tested, the current $I_{PAD}$ at the bod pad 21 is typically more than 1 mA, and $\Delta t$ would be less than 1.5 ns if the only capacitance was that of the bond pad 21. Therefore, a sufficiently large off-chip capacitance of known value is preferably connected to the bond pad 21, so that $\Delta t$ becomes longer than a clock cycle TCK 99w. For example, if the off-chip connected capacitance is 100 pF, and the drive current is 10 mA, then $\Delta t$ will be 15 ns. The modified TAP controller circuit 100 can generate an update-capture time interval of 15 ns when the TCK frequency is 33 MHz (and PadTest=1, FastPadTest=0). The prior art circuits 80 and 90 of FIG. 6A can provide an update-to-capture time interval of 15 ns for a 66 MHz system clock 95w frequency, as shown in FIG. 10.

If $\Delta t$ is pre-determined to be less than 15 ns ($C_{PAD}=100$ pF, $\Delta V=1.5$ V), it serves as a test for output drive current being greater than 10 mA. If the value latched at time $t_2=t_1+15$ ns is a logic 0, then drive is less than 10 mA; if the value latched is a logic 1, then drive is more than 10 mA.

If a larger off-chip load capacitance is connected, 1.67 nF for the present example, then the method of the present invention can test a 10 mA driver with the prior art IEEE 1149.1 boundary scan cell 40 of FIG. 3A and a test clock frequency of 10 MHz. However, the time during which the bond pad voltage is between its minimum and maximum voltage might be considered excessive, because it causes significant current to flow between the $V_{DD}$ and $V_{SS}$ power supplies of the input buffer 31. The circuits 80 and 90 of FIG. 6A and FIG. 6B, or the modified TAP controller circuit 100 of FIG. 7A permit much faster transitions to be tested according to the method of the present invention, and hence smaller capacitances can be connected and less current will flow in the input buffer 31.

There are several sources of inaccuracy in Equation 1.

The bond pad capacitance is typically not known accurately, especially if the leakage current is tested entirely via the test register of a boundary scan cell without any other connection to the bond pad 21 under test. The bond pad capacitance can typically be estimated to within ±40% by characterization of the IC or manufacturing process. When testing an IC, connecting a relatively large known capacitance to the bond pad of the IC greatly reduces the inaccuracy of $C_{PAD}$. For example, if the connected off-chip capacitance is known to be 100 pF ±5%, then the inaccuracy in $C_{PAD}$ becomes less than 6% (for $C_{PAD} \approx 1$ pF).

Characterization refers to the common procedure of accurately measuring a parameter of interest for many ICs. The procedure can be slow and complex, but is only performed on a statistically representative sample number of devices to determine an average value and standard deviation of the parameter.

An advantage of connecting an external capacitance or resistance to each pin of a packaged IC being tested, is that the integrity of the bond wire can be verified. The bond wire connects the bond pad 21 of the IC to the pin of the IC package, and is not tested using conventional wrap-around tests, as mentioned previously. An output drive current test performed according to the present invention, with an external capacitance, would fail an IC with an open-circuit bond wire because the transition time for the pin would be too fast, resulting in the conveyed current being apparently too small. The test for the input switching point voltage $V_{SW}$ (discussed later), which uses an external resistance, would also fail because the switching point would appear too low or too high.

The voltage change, $\Delta V$, is typically not known accurately because it depends on $V_{SW}$ of the input buffer 31. $V_{SW}$ is the input voltage above which the logic input buffer 31 detects a logic 1 and below which it detects a logic 0. $V_{SW}$ (and hence $\Delta V$) can typically be estimated to within ±20% by characterization of the IC or manufacturing process. It is also possible to directly measure $V_{SW}$ for one of the TAP input bond pads 98, 99, 111, 112 (FIG. 7C) and from this value predict $V_{SW}$ for all other fault-free input buffers 31 on the IC. This can typically reduce the inaccuracy to less than 10% (inherent mismatch between input buffers prevents reducing the inaccuracy to zero). The input switching point voltage $V_{SW}$ at a bond pad 21 can also be tested directly according to the present invention, as will be discussed later.

Method for Testing Current into or out of a Bond Pad, with Unknown Capacitance and Switching Point Voltage The method for testing output current for a pin or bond pad 21, as previously described herein assumes that the input switching point voltage $V_{SW}$ (and hence $\Delta V$) and capacitance C of the bond pad 21 are known with sufficient accuracy. The present method can be extended to make the output current test result independent of $V_{SW}$ and C by connecting a pull-up or pull-down resistance of known value to the bond pad 21 or pin.

Figure 11:
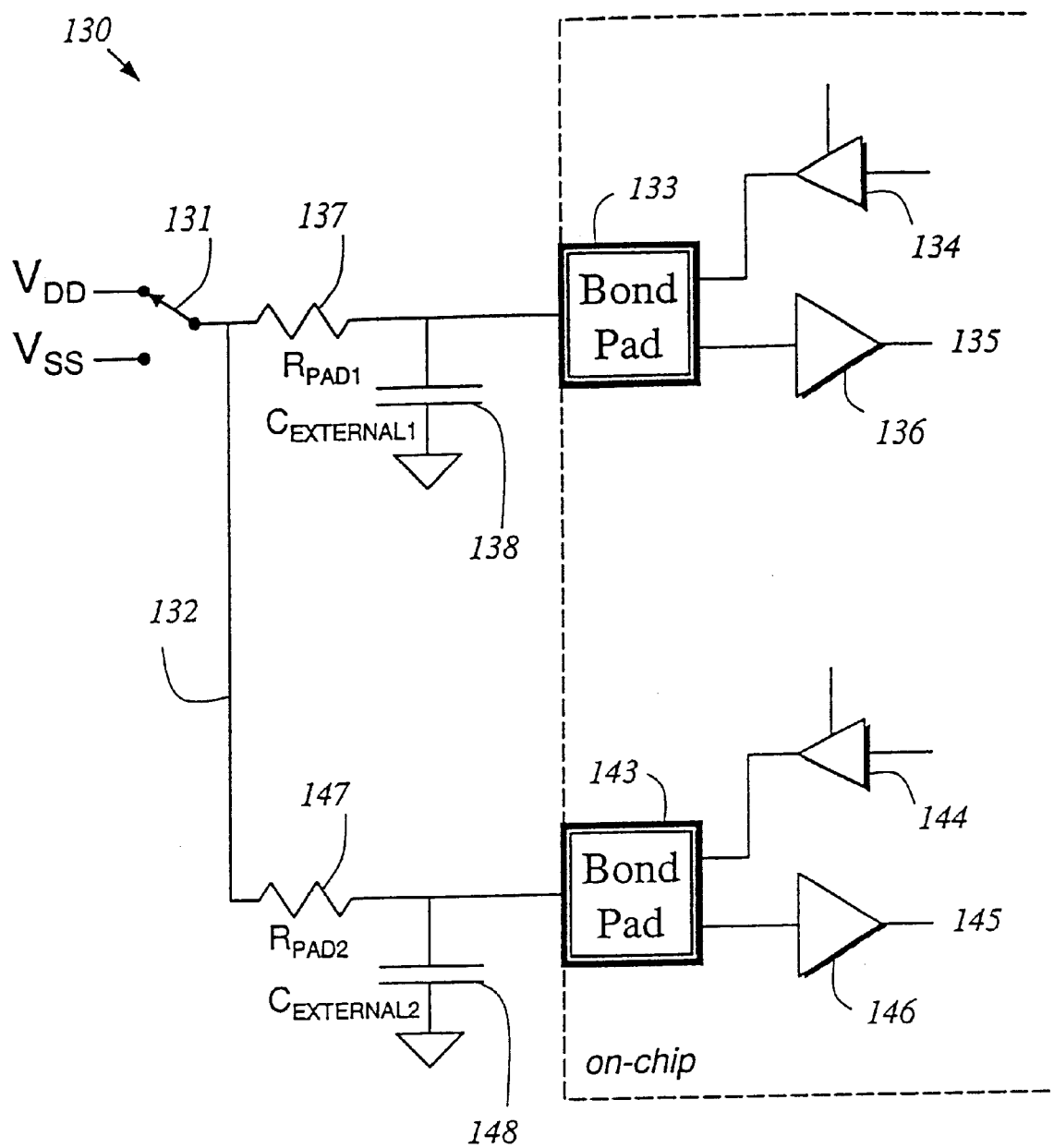
FIG. 11 is a circuit schematic showing off-chip connections to known capacitances and resistances, according to the present invention.

FIG. 11 shows an example of connection of off-chip resistance $R_{PAD}$ 137 and capacitance $C_{EXTERNAL}$ 138 to a bond pad 133. The bond pad 133 is provided with an input buffer 136 and a 3-state driver 134.

The test is performed as previously described for the leakage current test referring to FIG. 8, with the value for $\Delta t$ initially set to some value $\Delta T_0$ calculated according to Equation 1 using the maximum expected values of $\Delta V$ and C, and dividing the result by two. When the bond pad voltage is sampled by the logic circuit, if the detected logic value does not change relative to its initial value, indicating that $t_{SW}-t_1$ is greater than $\Delta t_0$, then $\Delta t$ is increased by $\Delta t_0/2$, otherwise $\Delta t$ is decreased by $\Delta t_0/2$. The test is then repeated with the new value of $\Delta t$, but, based on the result, $\Delta t$ is increased or decreased by $\Delta t_0/4$ instead. The test is repeated again, but based on the result, $\Delta t$ is increased or decreased by $\Delta t_0/8$, instead. The test may be repeated in this fashion a pre-determined number of times, or until $\Delta t$ ceases to change significantly—its value is then denoted as $\Delta t_1$. This search algorithm is commonly referred to as a binary search, however, other common search algorithms can be used, such as a linear search.

Using the search algorithm, the value $\Delta t_1$ is found which corresponds to the known resistance, the unknown capacitance, and the unknown switching point voltage. Next, a test is performed wherein the 3-state driver 35 drives the transition, instead of the resistance driving the transition, and the bond pad voltage is sampled after an update-to-capture time interval equal to $\Delta t_1 \times R_{DRIVER}/R_{KNOWN}$. $R_{DRIVER}$ is the minimum (or maximum) required output impedance of the 3-state driver 35. The output current of a bond pad driver is proportional to its output impedance, and $R_{DRIVER}$=VOL/IOL for falling transitions; $R_{DRIVER} \approx$ VOH/IOH for rising transitions. To simplify testing, $R_{KNOWN}$ can be chosen such that $R_{DRIVER}/R_{KNOWN}$ is a convenient ratio such as $2^N$ where N is an integer. If the input buffer 136 is a Schmitt-trigger input, then the off-chip known resistance is connected to $V_{DD}$ (pull-up) when testing VOH/IOH, and connected to $V_{SS}$ (pull-down) when testing VOU/IOL. The off-chip resistances $R_{PAD}$ 137, 147 for many bond pads 133, 143 or pins can be connected to a single node 132 that is selectably connected to $V_{DD}$ or $V_{SS}$ via a switch 131, as shown in FIG. 11 for two bond pads, 133 and 143.

Method for Testing Switching Point Voltage at a Bond Pad

The value of the switching point voltage $V_{SW}$ can be tested using a method similar to the method described for measuring leakage current at a bond pad 133 with known capacitance C. If a pull-up resistance 137 connected to a bond pad 133, as shown in FIG. 11, has a known value $R_{PAD}$, and the resistance 137 causes current to flow that is much greater than the leakage current at the bond pad 133, then a time interval can be determined which tests $V_{SW}$. To ensure sufficient accuracy, a known off-chip resistance $R_{PAD}$ 137 and off-chip capacitance C 138 are connected to the bond pad 133, and $\Delta t$ is pre-determined using an equation based upon the equation for the voltage across a capacitor C discharging through a series resistor R: $V=V_{DD}e^{-t/RC}$. The exact time, $t_{SW}$, that the input buffer 136 changes state will depend upon $R_{PAD}$, $C_{PAD}$ which includes the off-chip capacitance and $\Delta V$, according to Equation 2; where $\Delta t$, $\Delta V$ and $V_{DD}$ are as defined for Equation 1, and ln is the natural logarithm.

$$\Delta t = R_{PAD}C_{PAD}\ln(\Delta V/V_{DD}) \qquad \text{(Equation 2)}$$

For example, to test that a switching point voltage $V_{SW}$ is between 1 and 2 volts, for a circuit under test with $V_{DD}$=3 V, $V_{SS}$=0 V, $C_{PAD}$=1 nF, and $R_{PAD}$=100 kΩ connected between the bond pad 133 and $V_{SS}$, as shown in FIG. 11 with switch 137 connected to $V_{SS}$, the following procedure is used. The bond pad 133 is first driven to $V_{DD}$ at some time $t_0$, by the 3-state driver 134 connected to the bond pad 133, as controlled by a boundary scan cell. Any on-chip pull-up or pull-down circuit is preferably disabled, because its value is typically not known accurately and may significantly affect the test. At time $t_1$, after $t_0$, the 3-state driver 134 is disabled. The bond pad voltage will then discharge through the off-chip resistance $R_{PAD}$ 137. For the present example, $V_{SW}$=2 V, and $\Delta V=V_{DD}-V_{SW}$=1 V, therefore, $\Delta t$=40 µs according to Equation 2. For $V_{SW}$=1 V, and $\Delta V$=2 V, $\Delta t$ is calculated $\Delta t$=110 µs according to Equation 2. To test $V_{SW}$ for these example test limits, at pre-determined time $t_2$, which is 40 µs after $t_1$, the output 135 of the input buffer 136 is sampled. If the sampled value is a logic 1, then the capacitor 138 has not discharged to a voltage lower than $V_{SW}$, therefore $V_{SW}$ is less than 2 V; if the sampled value is a logic 0, then $V_{SW}$ is greater than 2 V and fails this test. The test sequence is then repeated starting from a new time $t_0$, and the value is sampled at a second predetermined time $t_2$, which is 110 μs after $t_1$. If the sampled value is a logic 0, then the capacitor voltage has discharged below $V_{SW}$, therefore $V_{SW}$ is greater than 1 V; if the sampled value is a logic 1, then $V_{SW}$ is less than 1 V and fails this test.

The switching point voltage test sequence can be performed for a discharging capacitance 138 as just described, or for a charging capacitance by first driving the bond pad 133 to $V_{SS}$ (instead of $V_{DD}$) at time $t_0$. Both sequences will give the same result for an input buffer 136 that has a single switching point. A Schmitt trigger input buffer has two switching point voltages: one for a rising input signal, and a second lower one for a falling input signal. In this case, the higher of the two switching point voltages is tested by charging the capacitance and deducing the time at which the switching point voltage is crossed, and the lower of the two switching point voltages is tested by discharging the capacitance. The circuit of FIG. 11 includes a switch 131 to facilitate connecting an external resistance 137 for each of a plurality of bond pads 133, 143 to $V_{DD}$ or $V_{SS}$ to allow simultaneous testing of many input buffers 136, 146 having one or two switching point voltages. The node 132 could also be driven directly by a test equipment digital signal.

Testing that an Enable Signal is not Stuck On

When testing the 3-state bond pad driver 35 of FIG. 2 for leakage, it is possible for the Enable input 36 to be stuck on (e.g., permanently connected to logic 1) due to some manufacturing defect. An impact of this defect would be that the leakage test, using the method of the present invention, would always indicate zero leakage current because the bond pad voltage would not change between time $t_1$ and time $t_2$. An additional test is performed to verify that the Enable signal 36 can, in fact, disable the 3-state driver 35.

Figure 12:
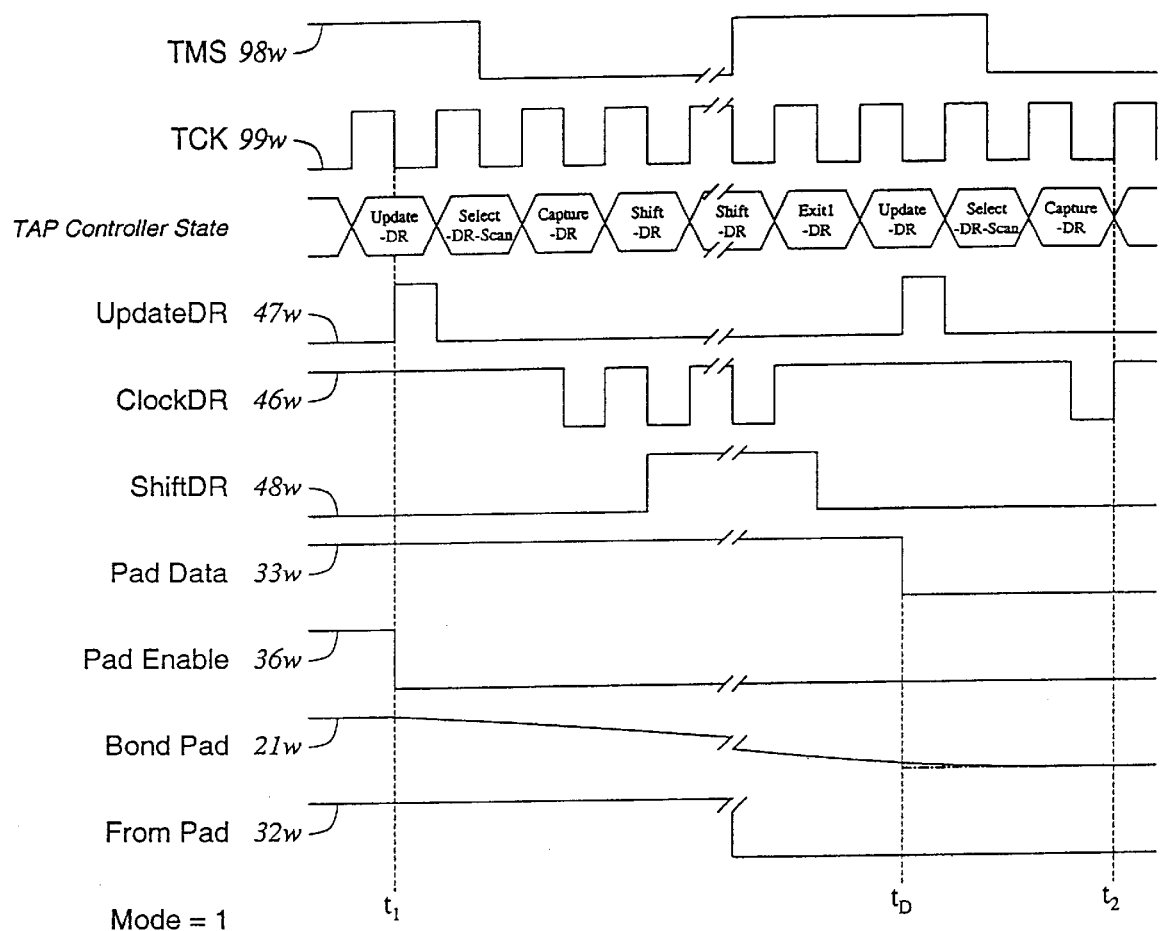
FIG. 12 is a chart showing typical waveforms for some nodes of the circuits in FIG. 4B and FIG. 4C when attempting to test the enable function of the 3-state bond pad driver with a prior art TAP controller having the state diagram of FIG. 5A.

A prior art general method for testing that the Enable signal 36 is functioning for a 3-state driver 35 is to drive the output to a logic value, then disable the driver, then change the input data value, and then sample the output value. For a fault-free 3-state driver 35, the output value will remain unchanged, assuming that leakage current is insignificant. This is not a safe assumption when the time interval between changing the data value and sampling the output is greater than a microsecond. FIG. 12 illustrates the waveforms when a conventional TAP controller 119 is used to implement the prior art general method for testing the enable function. At time $t_1$, as shown in waveform 47w, an UpdateDR pulse loads a scanned-in logic 0 for the Enable signal 36w, which disables the bond pad driver 35. Next, the entire boundary scan chain of the cells 216 (FIG. 2A) must be re-loaded so that an opposite data value can be loaded in for the 3-state driver 35 at time $t_D$. Lastly, the pad value 33w is latched at time $t_2$ during a CaptureDR state 72 (in FIG. 5A). Therefore, the number of TCK cycles needed to perform this test with a conventional IEEE 1149.1 TAP is a minimum of four TCK cycles plus the number of boundary scan cells 216, which is often greater than one hundred. For a 10 MHz TCK frequency and one hundred boundary scan cells 216, the time interval between disabling the 3-state driver 35 at time $t_0$ and subsequently latching its output value at time $t_2$ after a change in data is therefore greater than 100×100 ns=10 μs. As shown in FIG. 12, leakage current can cause the pad voltage 21w to discharge during this time interval, using Equation 1 with $C_{PAD}$=1 pF, $I_{PAD}$=100 nA, $\Delta V$=1 volt. For this reason, testing the enable signal 36 for a bond pad 35 that does not have a pull-up or pull-down is not practical using conventional boundary scan IEEE 1149.1.

Figure 13:
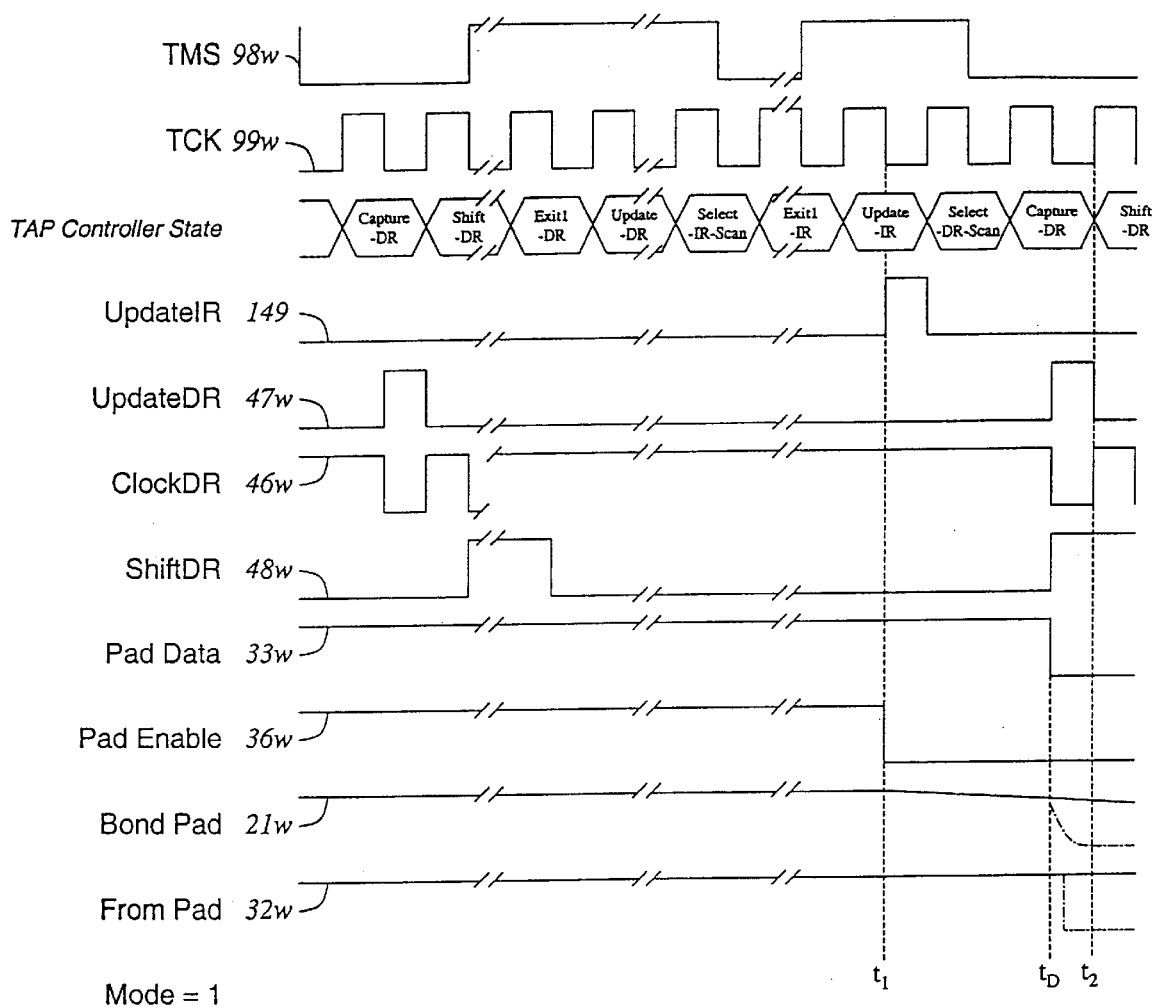
FIG. 13 is a chart showing waveforms for some nodes of the circuits in FIG. 4B and FIG. 4C when testing the enable function of the 3-state bond pad driver with prior art boundary scan cells, the modified TAP controller of FIG. 7A, and the method of the present invention.

The method for testing that the Enable signal 36 is functioning, according to the present invention, will be described referring to the circuit 67 of FIG. 4C as driven by the modified TAP controller 100 of FIG. 7A and the corresponding waveforms in FIG. 13. The test is for a bond pad 21 without a pull-up or pull-down circuit, and it verifies that if the voltage of the bond pad 21 is driven to a minimum or maximum voltage by a 3-state driver 35 which is then disabled, changing the logic value of the data input 33 to the driver does not affect the bond pad voltage 21w.

The circuit 100 is further modified to implement the Enable signal test as follows: the Enable input of the 3-state driver 35 is disabled by a ForceDisable signal which is a register bit in the Instruction Register whose value is scanned in through the TAP with each instruction, for example with the EXTEST instruction. When the EXTEST instruction is loaded during the Update-IR state, the ForceDisable bit is also updated to disable the 3-state bond pad drivers at time $t_1$ as shown in waveform 36w. At time $t_2$, an UpdateDR pulse occurs during the CaptureDR state because the PadTest signal 110 is logic 1. The UpdateDR pulse causes the new data value of waveform 33w to be loaded at time $t_D$. If the Enable function is working correctly, then the bond pad signal 32w will remain logic 1 until the value is captured at time $t_2$, as shown by the solid line of waveform 21w. If the Enable signal is stuck in the "on" state, then the bond pad signal will follow the pad data signal 33w level to a logic 0 value, as shown by the dash-dot line of waveform 21w. For a 10 MHz TCK frequency and any number of boundary scan cells 216, the time interval between disabling the 3-state driver 35 and subsequently latching its output value after a change in data, for this modified TAP controller 119 is reduced to 2½ TCK cycles which equals 250 ns.

To generalize, at some time $t_0$, the bond pad voltage is driven to its maximum voltage by the bond pad driver 35. At some time $t_1$, after $t_0$, the bond pad driver 35 is disabled. At time $t_D$, immediately after $t_1$, a change in data is applied to the driver 35. At pre-determined time $t_2$, the digital output of (non-inverting) input buffer 31 is sampled. The sampled value should be a logic 1; a logic 0 indicates a fault. Time $t_2-t_1$ is predetermined to be less than the time for the maximum acceptable leakage current to discharge the bond pad voltage. The sequence described is then repeated (not shown in FIG. 13), but instead driving the bond pad 21 to its minimum voltage and expecting a logic 0 to be sampled.

For the prior art circuits 80, 90 of FIG. 6A and FIG. 6B, when driven by the waveforms of FIG. 6C, a modification is needed to implement the Enable signal test according to the present invention. The Enable of the 3-state driver 35 is driven by the circuit 80 of FIG. 6A, as described in the patent by Cote et al, but the Update time is advanced in time for this test. Advancing the disable time is achieved by connecting the Mode signal 50 of all boundary cells 80 for Enable signals, to logic 1 instead of logic 0 for this test, or by connecting the FastUpdate input 87 to the FastUpdate2 waveform 87w-a instead of FastUpdate1 87w-b. The result is: for any TCK frequency that is much less than the system clock frequency, and for any number of boundary scan cells, the time interval between disabling the 3-state driver 35 and subsequently latching its output value after a change in data is less than two TCK cycles; as short as two system clock cycles when FastUpdate2 is used.

Testing Open-Drain 2-State Outputs

Figure 14:
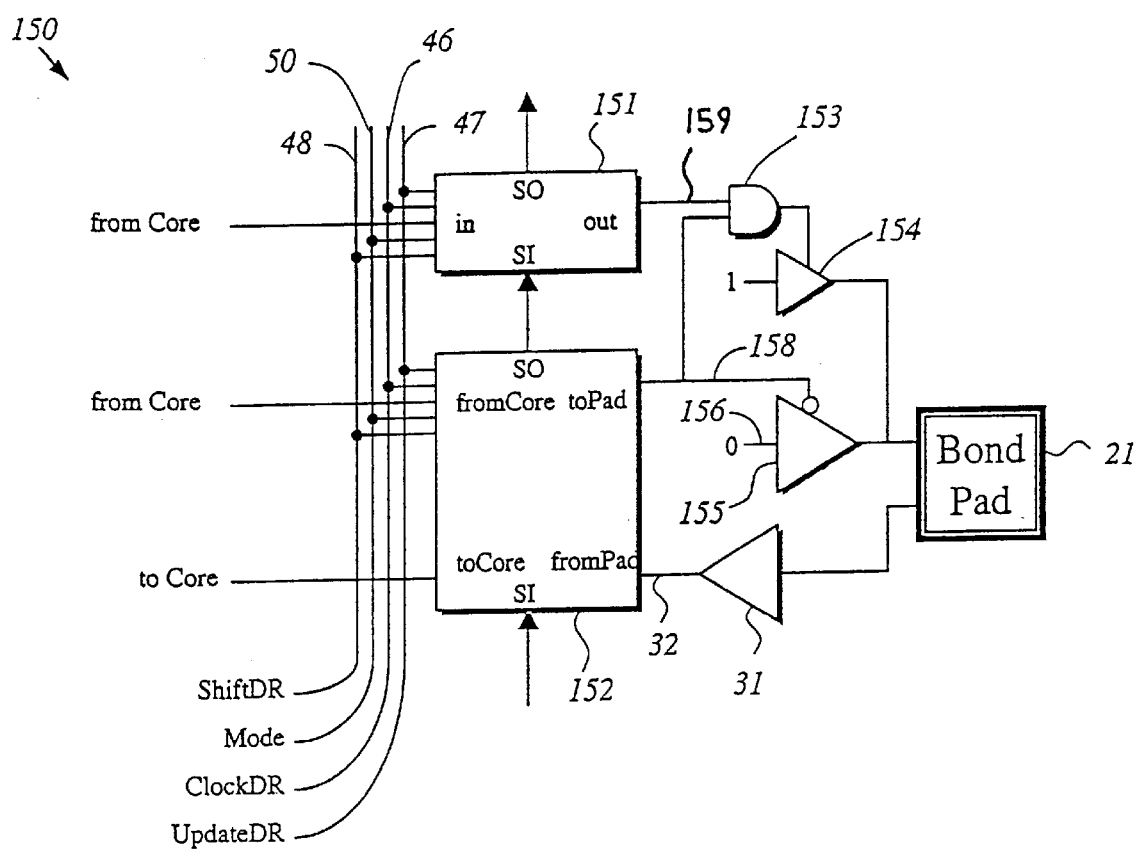
FIG. 14 is a circuit schematic showing a connection between a 2-state open-drain output bond pad and boundary scan cells configured to permit the output driver to be tested according to the method of the present invention.

Open-drain output drivers only drive one logic value with a low impedance state. The other logic value is typically delivered by an off-chip pull-up resistor when the open-drain driver is disabled and in a high impedance state. The circuit 150 in FIG. 14 shows how a 2-state open-drain driver 155 is modified to accommodate the test method of the present invention. The 2-state open-drain driver 155 is in this case a 3-state driver with logic 0 as its data input 156 and the data signal 158 as its Enable input. The open-drain driver 155, when the bond pad 21 is not connected to an off-chip load, is unable to drive the bond pad 21 to a logic 1 voltage. To allow wrap-around testing, a 3-state driver 154 is connected to the bond pad, in addition to connecting the input buffer 31. Instead of using a 3-state driver 154, a 2-state open drain driver that drives a logic 1 may also be used. The Enable of the 3-state driver 154 is controlled by the output 159 of boundary scan cell 151 combined with the data signal 158, i.e., the output of boundary scan cell 152, via an AND gate 153. The Enable signal 159 is shown as the output of dedicated boundary scan cell 151, but the Enable signal 159 may be shared by many bond pad drivers. The Enable signal 159 is set to logic 1 in bond pad test mode, and logic 0 otherwise. When the data 158 is logic 0, the bond pad 21 is driven to logic 0 by only the function driver, i.e., the 2-state open-drain driver 155. When the data 158 is logic 1, the bond pad 21 is driven to logic 1 by only the test-mode driver, i.e., the 3-state driver 154. The circuit 150 of FIG. 14 permits the DC characteristics of the open-drain driver 155 to be tested similarly to a 3-state driver, as previously described herein.

Testing Differential Outputs and Inputs

Differential output drivers drive a pair of bond pads to opposite logic values. Generally, the bond pads are tested as any other bond pads, according to the present invention, to ensure that bond pad drive and leakage currents are individually correct. For example, the two bond pads of circuit 130 in FIG. 11 could be the outputs of a differential driver. A constraint added by the differential relationship of the signals is that while one output bond pad 133 is tested with a rising transition, the other 143 is tested with a falling transition. Separate, single-ended input buffers 136 and 146 are required to sample the voltage at each bond pad 133, 143 during testing. If the testing conditions cause too much noise on the bond pad signals, a fully differential test is needed as described next.

Figure 15:
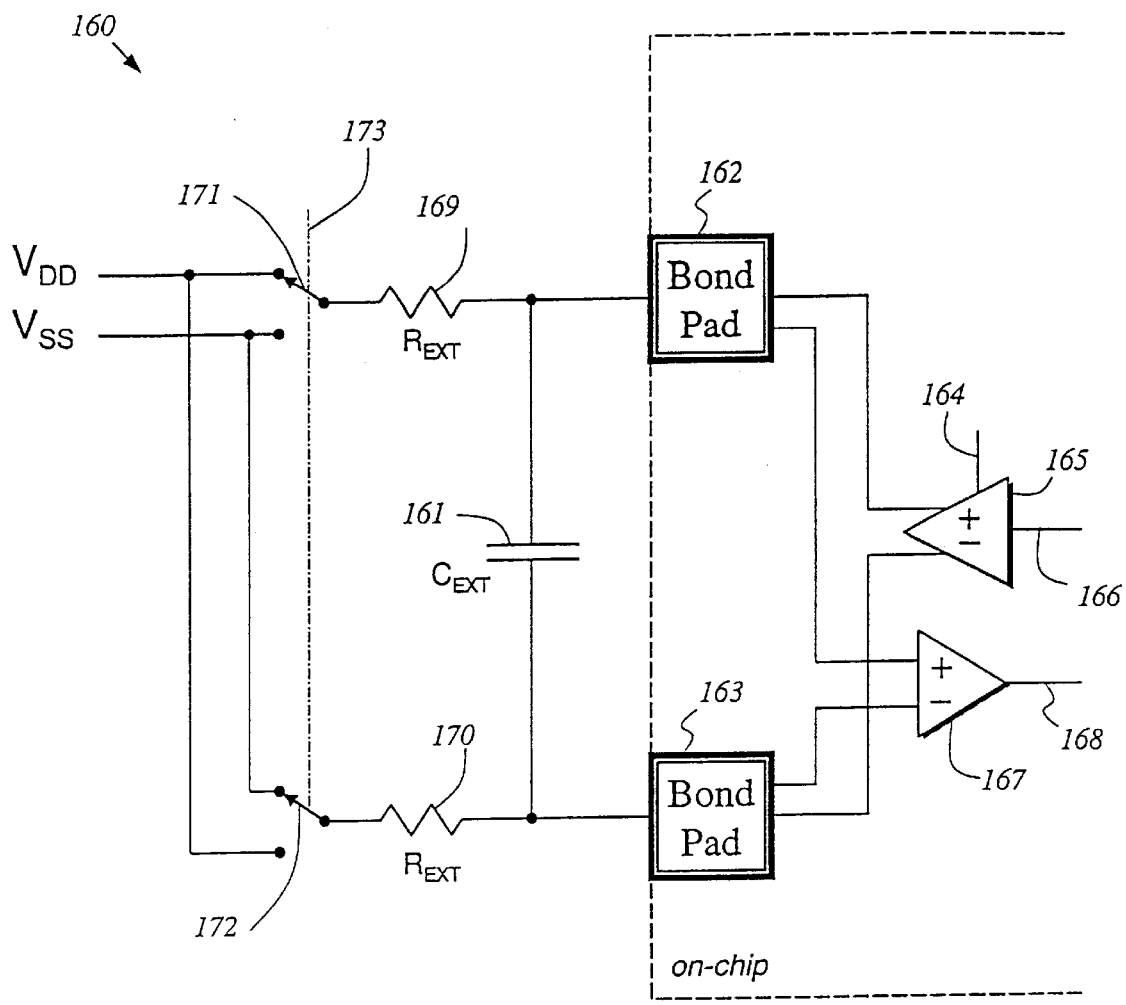
FIG. 15 is a circuit schematic showing connections for a differential pair of pins, according to the present invention.

For some differential output drivers, the output current for each output is inherently the same as for the other (but opposite in sign). For this case, and for 2-state drivers having irrelevant leakage current, a single off-chip known capacitance 161 is connected between the two pins or bond pads 162, 163 instead of between each pin and ground, and a differential input buffer 167 is differentially connected to the two pins or bond pads 162, 163, as shown in FIG. 15. The switching point voltage can be assumed to be midway between the minimum and maximum voltages. The output drive current test method is applied as though the input 166 to the differential driver 165 and the output 168 of the input buffer 167 are the input 33 (in FIG. 4C) to driver 35 and the output 32 of the buffer 31, respectively. The output drive current can be tested, using this arrangement, with very noisy signals because the test is fully differential.

Differential input buffers 167 receive a pair of signals whose values are nominally opposite logic values. The input switching point voltages of differential input bond pads 162, 163 can be tested as any other input bond pads, according to the present invention, except that while one input bond pad is tested with a rising transition, the other is tested with a falling transition. All positive input pins are connected via resistors 169 to a common switch 171, and all negative pins are connected via resistors 170 to a common switch 172, and the switches 171, 172 are operated by a common control signal 173 such that "positive" pins are pulled to the opposite logic value of the value applied to "negative" pins.

General

All of the circuitry of the present invention is digital and not sensitive to specific logic delays or layout. The circuitry may therefore be described in a hardware description language for automatic logic synthesis and layout.

The input buffer 31 is shown explicitly in FIG. 2, FIG. 4A, FIG. 4B, FIG. 4C, and FIG. 14 but its function can be incorporated into other circuitry, such as the multiplexer 44 or 92. The input buffer 31 can have any single switching point voltage, or it can be a Schmitt-trigger input which has one switching point voltage for rising signal transitions, and a second, lower, switching point voltage for falling signal transitions.

The tests for input and output current can also be applied to analog circuitry. The bond pad driver 35 could be an analog amplifier. The input buffer 31 could be a logic buffer which is used for test purposes only, or it could be an analog amplifier of known gain whose output signal is converted to a digital value by a logic gate.

Some digital output bond pad drivers are "slew-limited", meaning that their output voltage transition rate for small capacitance loads is limited to a maximum rate. Normally this rate will be much faster than the rate required for the method of the present invention, and so the slew-limiting circuitry will have no effect. If the slew-limited rate is slower than the rate used for this method, then the slew-limiting circuitry needs to be disabled during the test. When testing path delays at the wafer-level (for which capacitance is minimal and therefore will activate slew limiting), according to the method of the present invention, the test is preferably run with and without slew-limiting enabled, with different predetermined time intervals. Any difference in the tested transition times will indicate that the slew limiting circuitry is functioning.

The tests described herein can also test ICs connected to other circuitry within a system, for example on a printed circuit board. In this case, the capacitance for a pin might be significantly larger than a bond pad alone, allowing slower test frequencies to be applied and allowing more accurate testing. Also, many arrangements of non-integrated circuit elements on the circuit board can be tested, for example pull-up and pull-down resistors, and series RC filters.

While particular embodiments of the present invention have been shown and described, changes and modifications may be made to such embodiments without departing from the true scope of the invention.

What is claimed is:

1. A method for testing current flowing through a circuit node of a circuit under test, the circuit under test including drive circuitry that drives the circuit node to a maximum and to a minimum voltage during testing, and including a logic circuit that samples the logic level of the circuit node synchronously to a clock signal, the circuit node having a capacitance, and the logic circuit having an input switching point voltage, the method comprising the steps of:

(a) driving the circuit node to a known voltage, via the drive circuitry that drives the circuit node;

(b) causing a signal transition at the circuit node via the drive circuitry;

(c) sampling a logic value of a voltage of the circuit node, via the logic circuit, at a predetermined time interval after the beginning of the signal transition, the time interval being less than an expected signal transition time and being proportional to values of the capacitance of the circuit node, the input switching point voltage of the logic circuit, and the current flowing through the circuit node; and (d) passing or failing the test, based on the logic value sampled by the logic circuit during the signal transition.

2. The method of claim 1, wherein the predetermined time interval having a duration so that, when the current flowing through the capacitance of the circuit node is less than a minimum specified value, the logic circuit generates a failing response in step (d).

3. The method of claim 1 further comprising:

(e) repeating steps (a) to (d) with different predetermined intervals to obtain cumulative test results; and (f) based on the cumulative test results, deducing a value of a current flowing through the capacitance of the circuit node.

4. The method of claim 1, wherein step (b) uses a first edge of the test clock to generate the signal transition on the circuit node via the drive circuitry;

step (c) uses a second edge of opposite polarity of the test clock to sample the voltage of the circuit node; and step (c) uses an interval between the first and second edges as the predetermined interval.

5. The method of claim 1, wherein the circuit under test is compliant with the requirements of the IEEE 1149.1 boundary scan standard, and has a test access port (TAP) controller and a clock controlling the TAP controller.

6. The method and circuit of claim 5, wherein step (c) controls the predetermined time interval by adjusting the frequency of the clock controlling the TAP controller.

7. The method of claim 1, wherein the predetermined time interval having a duration so that, when the current flowing through the capacitance of the circuit node exceeds a maximum specified value, the logic circuit generates a failing response in step (d).

8. The method of claim 7, wherein step (a) uses as the drive circuitry a 3-state driver having a data input and enable input;

step (b) generates the signal transition by disabling the 3-state driver via the enable input, and then changing the logic value of the data input; and step (d) provides a failing response indicating that the disabling action did not take effect.

9. The method of claim 1, wherein step (a) drives two circuit nodes using the drive circuitry which is a differential driver that drives both nodes, each circuit node having the logic circuit which is a differential comparator that samples the difference between the voltage at one circuit node and the voltage at the other circuit node.

10. The method of claim 9, wherein step (a) provides a known capacitance between the two circuit nodes; and step (c) uses the value of the known capacitance to determine the predetermined time interval.

11. The method of claim 1, wherein the method and the circuit under test are compliant with the requirements of the IEEE 1149.1 boundary scan standard.

12. The method of claim 11, wherein step (c) controls the predetermined time interval by adjusting the number of clock cycles occurring between an Update-DR state and a Capture-DR state.

13. The method of claim 11, wherein step (c) controls the predetermined time interval by adjusting the frequency of the clock controlling the TAP controller.

14. The method of claim 1, wherein the circuit under test has a known resistance connected between the circuit node and a constant voltage, and step (c) comprises:

(i) deducing a transition time when the known resistance is driving the capacitance, the transition time becoming a reference transition time;

(ii) obtaining a ratio between the known resistance and an output impedance of the drive circuitry; and (iii) determining the predetermined time interval for passing or failing the drive circuitry based on the reference transition time and the ratio between the known resistance and the output impedance of the drive circuitry.

15. The method of claim 14, wherein step (iii) determines the predetermined time interval so that, when the current conveyed through the circuit node exceeds a maximum specified value, the output of the logic circuit generates a failing response in step (d).

16. The method of claim 14, wherein step (iii) determines the predetermined time interval so that, when the current conveyed through the circuit node is less than a minimum specified value, the output of the logic circuit generates a failing response in step (d).

17. The method of claim 14 further comprising:

(e) repeating steps(a) to (d) with different predetermined intervals to obtain cumulative test results; and (f) based on the cumulative test results, deducing the value of a current conveyed through the circuit node.

18. The method of claim 1, wherein the circuit under test has a known resistance connected between the circuit node and a known voltage, the value of the capacitance of the circuit node is known;

step (a) drives the circuit node to the minimum or maximum voltage; and step (b) disables the drive circuitry to a high impedance state to cause the signal transition to be proportional to the known resistance and the capacitance.

19. The method of claim 18, wherein step (c) determines the predetermined time interval so that, when the switching point voltage of the logic circuit exceeds a maximum specified value, the output of the logic circuit generates a failing response in step (d).

20. The method of claim 19, wherein the input switching point voltage is tested for both rising and falling signal transitions.

21. The method of claim 18, wherein step (c) determines the predetermined time interval so that, when the switching point voltage of the logic circuit is less than a minimum specified value, the output of the logic circuit generates a failing response in step (d).

22. The method of claim 21, wherein the input switching point voltage is tested for both rising and falling signal transitions.

23. The method of claim 18 further comprising:

(e) repeating steps(a) to (d) with different predetermined intervals to obtain cumulative test results; and (f) based on the cumulative test results, deducing the value of the switching point voltage of the logic circuit.

24. The method of claim 23, wherein the value of the input switching point voltage is deduced for both rising and falling signal transitions.

25. A method for testing drive current flowing through a circuit node of a circuit under test, the circuit under test including drive circuitry for driving the circuit node to a maximum and to a minimum voltage during testing, and a logic circuit for sampling the logic level of the circuit node, the circuit node having a capacitance, and the logic circuit having an input switching point voltage, the method comprising the steps of:

determining a time interval for a signal transition on said circuit node that is less than an expected transition time of said signal transition and proportional to values of the capacitance of said circuit node, the input switching point voltage for said circuit node, and the current flowing through said circuit node;

generating a signal transition on the circuit node via the drive circuitry in response to a first edge of a first clock which immediately follows an edge of a test clock used to generate test control signals, said first clock having a significantly higher frequency than said test clock;

sampling a logic value of a voltage of the circuit node via the logic circuit in response to a subsequent edge of said first clock spaced from said first edge by said time interval; and passing or failing the test based on the sampled logic value of the voltage of the circuit node.

26. The method of claim 25, wherein said determining a time interval including selecting a frequency of said first test clock to provide the determined time interval between said first and subsequent edges of said first test clock.

27. The method of claim 25, wherein the circuit under test is compliant with the requirements of the IEEE 1149.1 boundary scan standard.

28. The method of claim 27, wherein said determining a time interval including selecting a frequency of said first test clock to provide the determined time interval between said first and subsequent edges of said first test clock.

29. A control signal modifying circuit for modifying a test control signal generated by a test controller for controlling drive circuitry that drives a circuit node of a circuit under test and logic circuitry that samples the voltage of the circuit node, the test controller having a test clock for generating the test control signal and transitions between states for the test controller, the control signal modifying circuit comprising:

receiving means for receiving the test control signal generated by the test controller;

modifying means for modifying the test control signal to provide a predetermined time interval which is less than an expected signal transition time and proportional to values of the capacitance of the circuit node, the input switching point voltage of the logic circuit, and the current flowing through the circuit node; and outputting means for outputting the modified test control signal to the drive circuitry and logic circuitry.

30. The control signal modifying circuit of claim 29, wherein the modifying means includes:

means for detecting a first edge of the test clock which generates the signal transition on the circuit node via the drive circuitry; and means for detecting a second edge of opposite polarity of the test clock to sample the voltage of the circuit node.

31. The control signal modifying circuit of claim 29, wherein the circuit under test and the test controller are compliant with the requirements of the IEEE 1149.1 boundary scan standard.

32. A control signal modifying circuit for modifying a test control signal generated by a test controller for controlling drive circuitry that drives a circuit node of a circuit under test and logic circuitry that samples the voltage of the circuit node, the test controller having a first test clock for generating the test control signal and transitions between states for the test controller, the control signal modifying circuit comprising:

first receiving means for receiving the first test clock;

second receiving means for receiving a second clock with a significantly higher frequency than the first test clock;

detecting means for detecting an edge of the second test clock, which immediately follows an edge of the first test clock, and generates a signal transition on the circuit node via the drive circuitry;

controlling means for controlling a subsequent edge of the second test clock to sample the voltage of the circuit node, such that a time interval between the edges of the second test clock is less than an expected transition time of the signal transition and proportional to values of the capacitance of the circuit node, the input switching point voltage for the circuit node, and the current flowing through the circuit node.

33. The control signal modifying circuit of claim 32, wherein the controlling means has a frequency adjuster for adjusting the frequency of the second test clock to control the time interval between the edges of the second test clock.

34. The control signal modifying circuit of claim 32, wherein the circuit under test and the test controller are compliant with the requirements of the IEEE 1149.1 boundary scan standard.

35. The control signal modifying circuit of claim 34, wherein the controlling means has a frequency adjuster for adjusting the frequency of the second test clock to control the time interval between the edges of the second test clock.

36. Testing circuitry for testing current flowing through a circuit node of a circuit under test, the circuit node having a capacitance, the testing circuitry comprising:

drive circuitry that drives the circuit node to a maximum and to a minimum voltage during testing;

a logic circuit that samples the logic level of the circuit node synchronously to a clock signal, the logic circuit having an input switching point voltage;

a test controller for controlling the drive circuitry and the logic circuitry, the test controller having a test clock for generating the test control signal and transitions between states for the test controller; and a control signal modifying circuit for modifying the test control signal to provide a predetermined time interval which is less than an expected signal transition time and proportional to values of the capacitance of the circuit node, the input switching point voltage of the logic circuit, and the current flowing through the circuit node.

37. The testing circuitry of claim 36, wherein the control signal modifying circuit includes:

means for detecting a first edge of the test clock which generates the signal transition on the circuit node via the drive circuitry; and means for detecting a second edge of opposite polarity of the test clock to sample the voltage of the circuit node.

38. The testing circuitry of claim 36, wherein
the circuit under test and the testing circuitry are compliant with the requirements of the IEEE 1149.1 boundary scan standard.

39. Testing circuitry for testing current flowing through a circuit node of a circuit under test, then circuit node having a capacitance, the testing circuitry comprising:

drive circuitry that drives the circuit node to a maximum and to a minimum voltage during testing;

a logic circuit that samples the logic level of the circuit node synchronously to a clock signal, the logic circuit having an input switching point voltage;

a test controller for controlling the drive circuitry and the logic circuitry, the test controller having a first test clock for generating the test control signal and transitions between states for the test controller;

a control signal modifying circuit having:
  first receiving means for receiving the first test clock;
  second receiving means for receiving a second clock with a significantly higher frequency than the first test clock;
  detecting means for detecting an edge of the second test clock, which immediately follows an edge of the first test clock, and generates a signal transition on the circuit node via the drive circuitry;
  controlling means for controlling a subsequent edge of the second test clock to sample the voltage of the circuit node, such that a time interval between the edges of the second test clock is less than an expected transition time of the signal transition and proportional to values of the capacitance of the circuit node, the input switching point voltage for the circuit node, and the current flowing through the circuit node.

40. The testing circuitry of claim 39, wherein the controlling means has a frequency adjuster for adjusting the frequency of the second test clock to control the time interval between the edges of the second test clock.

41. The testing circuitry of claim 39, wherein the circuit under test and the testing circuitry are compliant with the requirements of the IEEE 1149.1 boundary scan standard.

42. The testing circuitry of claim 41, wherein the controlling means has a frequency adjuster for adjusting the frequency of the second test clock to control the time interval between the edges of the second test clock.

43. A circuit for use in testing drive current flowing through a circuit node of a circuit under test, the circuit under test having drive circuitry for driving the circuit node to a maximum and to a minimum voltage during testing, and a logic circuit for sampling the logic level of the circuit node, the circuit node having a capacitance, and the logic circuit having an input switching point voltage, the circuit comprising:

a first circuit for generating a signal transition on the circuit node via said drive circuitry in response to an edge of a first clock which immediately follows an edge of a test clock, said first clock having a higher frequency than said test clock; and a second circuit for generating a sampling signal for sampling a logic value of the voltage of said circuit node via said logic circuit in response to a subsequent edge of said test clock, said second circuit providing a time interval between said edges of said first clock which is less than an expected transition time of said signal transition and proportional to values of the capacitance of said circuit node, an input switching point voltage for said circuit node, and current flowing through said circuit node.

44. A method as defined in claim 1, said drive circuitry being a 3-state driver having a data input, an enable input, and an output, said circuit having an IEEE 1149.1 compliant test access port (TAP) and a TAP controller, said method testing said enable input of said driver and further comprises:

step (b) includes disabling said driver during an Update-IR state of said TAP controller and changing the logic value of said data input after said driver is disabled and before step (c) is performed;

step (c) comprises capturing the output logic value of said driver during a Capture-DR state of said TAP controller and said time interval being less than the time for a maximum acceptable leakage current to discharge the voltage of said circuit node sufficiently to change the logic value of said circuit node; and step (d) comprises comparing the sampled output logic value with an expected logic value of a properly functioning driver.

45. A method as defined in claim 44, wherein step (a) comprises driving said circuit node to a maximum voltage; and after completing step (d), repeating steps (a) to step (d) but with step (a) driving said circuit node to a minimum voltage..

46. A circuit for use in testing an enable input of a 3-state driver which drives a circuit node of an integrated circuit to a maximum and to a minimum voltage during testing, the driver having a data input, an enable input, and an output, said integrated circuit having an IEEE 1149.1 compliant test access port (TAP) and a TAP controller, and a logic circuit for sampling the logic level of the circuit node, the circuit node having a capacitance, and the logic circuit having an input switching point voltage, the circuit comprising:

means for causing a signal transition at the circuit node via the drive circuitry and for disabling said driver during an Update-IR state of said TAP controller and for changing the logic value of said data input after said driver has been disabled and before sampling the logic value of said circuit node; and means for sampling a logic value of a voltage of the circuit node via the logic circuit under control of said clock signal at a predetermined time interval after the beginning of said signal transition, said time interval being less than the time for a maximum acceptable leakage current to discharge the voltage of said circuit node sufficiently to change the logic value of said circuit node, and the current flowing through the circuit node, said sampling means capturing the output logic value of said driver during a Capture-DR state of said TAP controller.

47. A method for testing leakage current flowing through a circuit node of a circuit under test, the circuit under test including drive circuitry that drives the circuit node to a maximum and to a minimum voltage during testing, and including a logic circuit that samples the logic level of the circuit node synchronously to a clock signal, the circuit node having a capacitance, and the logic circuit having an input switching point voltage, the method comprising the steps of:

(a) determining a time interval for a signal transition on said circuit node that is less than an expected transition time of said signal transition and proportional to values of the capacitance of said circuit node, the input switching point voltage for said circuit node, and leakage current flowing through said circuit node;

(b) driving the circuit node to a known voltage via the drive circuitry that drives the circuit node;

(c) causing a signal transition at the circuit node via the drive circuitry;

(d) sampling a logic value of a voltage of the circuit node via the logic circuit at a said time interval after the beginning of the signal transition; and (e) passing or failing the test based on the logic value sampled by the logic circuit during the signal transition.

* * * * *

UNITED STATES PATENT AND TRADEMARK OFFICE
CERTIFICATE OF CORRECTION

PATENT NO.   : 6,586,921 B1
DATED        : July 1, 2003
INVENTOR(S)  : Stephen Kenneth Sunter It is certified that error appears in the above-identified patent and that said Letters Patent is hereby corrected as shown below:

<u>Column 24,</u>
Line 66, reads as "under test, then circuit", should read -- under test, the circuit --.

<u>Column 26,</u>
Line 16, reads "voltage..", should read -- voltage. --.

Signed and Sealed this

Sixth Day of January, 2004

JAMES E. ROGAN
*Director of the United States Patent and Trademark Office*